United States Patent [19]

Takasaki et al.

[11] Patent Number: 5,233,265
[45] Date of Patent: Aug. 3, 1993

[54] PHOTOCONDUCTIVE IMAGING APPARATUS

[75] Inventors: Yukio Takasaki, Kawasaki; Kazutaka Tsuji, Hachioji; Tatsuo Makishima, Mitaka; Tadaaki Hirai, Koganei, all of Japan; Sachio Ishioka, Burlingame, Calif.; Tatsuro Kawamura; Keiichi Shidara, both of Tama, Japan; Eikyu Hiruma, Komae, Japan; Kenkichi Tanioka, Tokyo, Japan; Junichi Yamazaki, Kawasaki, Japan; Kenji Sameshima, Hachioji, Japan; Hirokazu Matsubara, Tokyo, Japan; Kazuhisa Taketoshi, Sagamihara, Japan; Mitsuo Kosugi, Tokyo, Japan; Shiro Suzuki, Yokosuka, Japan; Takashi Yamashita, Sagamihara, Japan; Masaaki Aiba; Yoshizumi Ikeda, both of Tokyo, Japan; Tsuyoshi Uda, Kodaira, Japan; Naohiro Goto, Machida, Japan; Yasuhiko Nonaka; Eisuke Inoue, both of Mobara, Japan; Hirofumi Ogawa, Hachioji, Japan

[73] Assignees: Hitachi, Ltd.; Nippon Hoso Kyokai, both of Tokyo, Japan

[21] Appl. No.: 561,678

[22] Filed: Aug. 1, 1990

Related U.S. Application Data

[63] Continuation-in-part of Ser. No. 420,773, Oct. 12, 1989, Pat. No. 4,952,839, which is a continuation of Ser. No. 69,156, Jul. 12, 1987, Pat. No. 4,888,521, and a continuation-in-part of Ser. No. 155,809, Feb. 16, 1988, Pat. No. 4,980,736.

[30] Foreign Application Priority Data

| Jul. 4, 1986 | [JP] | Japan | 61-156317 |
| Oct. 29, 1986 | [JP] | Japan | 61-255671 |
| Oct. 29, 1986 | [JP] | Japan | 61-255672 |
| Nov. 25, 1986 | [JP] | Japan | 61-278635 |
| Jan. 14, 1987 | [JP] | Japan | 62-4865 |
| Jan. 14, 1987 | [JP] | Japan | 62-4867 |
| Jan. 14, 1987 | [JP] | Japan | 62-4869 |
| Jan. 14, 1987 | [JP] | Japan | 62-4871 |
| Jan. 14, 1987 | [JP] | Japan | 62-4872 |
| Jan. 14, 1987 | [JP] | Japan | 62-4873 |
| Jan. 14, 1987 | [JP] | Japan | 62-4875 |
| Mar. 23, 1987 | [JP] | Japan | 62-65633 |
| Mar. 23, 1987 | [JP] | Japan | 62-65634 |
| Jun. 17, 1987 | [JP] | Japan | 62-149023 |

[51] Int. Cl.⁵ .................. H01J 31/26; H01J 31/48; H01J 31/38
[52] U.S. Cl. .................. 313/366; 313/385; 313/386; 313/387
[58] Field of Search .............. 313/366, 385, 386, 387, 313/384

[56] References Cited

U.S. PATENT DOCUMENTS 3,020,442   2/1962   Nicholson et al. ............ 313/385 X (List continued on next page.)

Primary Examiner—Palmer C. DeMeo
Attorney, Agent, or Firm—Antonelli, Terry, Stout & Kraus

[57] ABSTRACT

A photoconductive device having a photoconductive layer which includes an amorphous semiconductor layer capable of charge multiplication in at least a part thereof is disclosed. The method of operating such a photoconductive device is also disclosed. By using the avalanche effect of the amorphous semiconductor layer, it is possible to realize a highly sensitive photoconductive device while maintaining low lag property. In one aspect of the present invention, the amorphous semiconductor layer is amorphous Se. In another aspect of the present invention, the amorphous semiconductor layer is composed mainly of tetrahedral elements including at least an element of hydrogen or halogens. When using the amorphous semiconductor layer composed mainly of tetrahedral elements, the charge multiplication effect is produced mainly in the interior of the amorphous semiconductor, and thus it is possible to obtain a thermally stable photoconductive device having a high sensitivity while keeping a good photoresponse.

19 Claims, 19 Drawing Sheets

U.S. PATENT DOCUMENTS

| | | | |
|---|---|---|---|
| 3,610,987 | 10/1971 | Van Den Broer et al. | 313/385 |
| 3,633,077 | 1/1972 | Tsuji et al. | 313/367 X |
| 3,892,966 | 7/1975 | Riedel et al. | 313/385 X |
| 4,128,844 | 12/1978 | Illenberger et al. | 313/366 |
| 4,329,699 | 5/1982 | Ishihara et al. | |
| 4,524,237 | 6/1985 | Ross et al. | |
| 4,636,682 | 1/1987 | Kusano et al. | 313/387 X |
| 4,888,521 | 12/1989 | Tanioka et al. | 313/366 |
| 4,952,839 | 8/1990 | Tanioka et al. | 313/366 |
| 4,980,736 | 12/1990 | Takasaki et al. | 357/30 |

FOREIGN PATENT DOCUMENTS

| | | |
|---|---|---|
| 39219 | 11/1981 | European Pat. Off. |
| 151754 | 8/1985 | European Pat. Off. |
| 163468 | 12/1985 | European Pat. Off. |
| 192473 | 8/1986 | European Pat. Off. |
| 194329 | 9/1986 | European Pat. Off. |
| 276683 | 8/1988 | European Pat. Off. |
| 283699 | 9/1988 | European Pat. Off. |
| 43-18643 | 10/1965 | Japan. |
| 49-24619 | 7/1972 | Japan. |
| 52-144992 | 5/1976 | Japan. |
| 57-21876 | 7/1980 | Japan. |
| 59-26154 | 6/1984 | Japan. |
| 61-222383 | 3/1985 | Japan. |
| 26-2435 | 6/1985 | Japan. |
| 824918 | 12/1959 | United Kingdom. |

OTHER PUBLICATIONS

Sze, S. M., *Physics of Semiconductor Devices*, pp. 56–65, "Phonon Spectra and Properties of Semiconductors", Wiley Interscience.

Grant, W. N., *Solid-State Electronics*, vol. 16, pp. 1189–1203, "Electron and Hole Ionization Rates in Epitaxial Silicon at High Elec. Fields", Pergamon Press.

Juska, G. et al., *Physica Status Solidi* (a), vol. 77, pp. 387–391, "Features of Hot Carriers in Amorphous Selenium".

Juska, G. et al, *Physica Solidi* (a), vol. 59, pp. 389–393, "Impact Ionization and Mobilities of Charge Carriers at High Electric Fields in Amorphous Selenium".

Umebu, I., et al, *Appl. Phys. Lett.*, 36(4), "Ionization Coefficients Measured in Abrupt InP Junctions".

Field-Effect Transistor Versus Analog Transistor (Static Induction Transistor), IEEE Transactions . . . pp. 185–197, vol. Ed.-22, No. 4, Apr. 1975.

VALENCE BAND EDGE

PHOTOCONDUCTIVE IMAGING APPARATUS

BACKGROUND OF THE INVENTION

This application is a continuation-in-part application of application Ser. No. 07/420,773, filed Oct. 12, 1989, now U.S. Pat. No. 4,952,839, which is a continuation application of application Ser. No. 07/069,156, filed July 12, 1987, now U.S. Pat. No. 4,888,521, and is a continuation-in-part of application Ser. No. 07/155,809, filed Feb. 16, 1988, now U.S. Pat. No. 4,980,736. The contents of each of Ser. No. 07/420,773, filed Oct. 12, 1989, and Ser. No. 07/155,809, filed Feb. 16, 1988, are incorporated herein by reference in their entirety.

This invention relates to a photoconductive device and to a photoelectric conversion device (hereinafter photoconductive device) for converting light into an electric signal, and in particular to such device having a high sensitivity, utilizing the charge multiplication effect. More specifically, the present invention relates to such device and a method for operating the same and, in particular, to such device mainly composed of amorphous semiconductors and including a photoconductive layer having significantly raised sensitivity and blocking contact under the state that fine photo response is maintained, and to its operating method.

Photoconductive devices according to the present invention include solid-state photoconductive devices of laminated photoconductive layer type such as photocells, one dimensional image sensors and two dimensional image sensors, and photoconductive devices represented by photoconductive image pick-up tubes. Further, photoconductive devices according to the present invention include photoconductive devices used to read out the signal charge by means of electronic switches or the like and photoconductive devices used for optical communication or the like.

Heretofore, as photoelectric conversion elements (photoconductive devices), whose principal component is an amorphous semiconductor, there are known a photocell, a one-dimensional image sensor (e.g., JP-A-52-144992), A two-dimensional image sensor combining a solid state drive circuit with an amorphous semiconductor (e.g., JP-B-59-26154), a photoconductive image pick-up tube (e.g., JP-A-49-24619), etc. Some of these photoconversion devices adopt a blocking type structure having a junction characteristic of preventing charge injection from the signal electrodes to the photoconductive layer and some others adopt a structure, by which charge is injected from one or both of the electrodes, a so-called injection type structure.

In an injection type element, since it is inherently possible to take-out charge carriers which are larger in number than the incident photons, a high sensitivity with a gain greater than 1 can be realized. In order to increase the s sensitivity of the photoconversion element stated above, an imaging device has been proposed, in which a reading-out circuit and a photoconductive layer having e.g., phototransistor characteristics are overlaid upon each other (JP-A-61-222383).

In order to achieve a similar object, a method utilizing an electrostatic induction type transistor as a device having multiplication effect in its photoelectric converting portion itself has been proposed (IEEE Transactions on Electron Devices, Vol. ED 22, (1975) pages 185–197). There has been proposed (JP-A-57-21876) also a method, by which a $p^+\pi p\, n\, n^+$ structure is formed using an amorphous semiconductor, whose principal component is Si containing hydrogen and/or halogen (e.g., fluorine, chlorine, etc.), which structure is similar to that formed using crystalline Si, in which avalanche multiplication takes place in the depletion layer of its p-n junction portion in order to amplify signals. On the other hand, in the case where the blocking type structure having a characteristic of preventing charge injection from the exterior of the photoconductive layer is adopted, since only the portion of the incident light, which is converted into electric charge within the photoconductive layer, generates a signal current, the gain of the photoelectric conversion is always smaller than 1.

As described above, when the injection type structure is adopted for a photoelectric conversion device such as a photocell, a one-dimensional image sensor, a photoconductive layer piled-up type solid state photosensitive device, etc., since it is inherently possible to take-out charge carriers larger in number than the incident photons, a high sensitivity with a gain greater than 1 can be realized. However, by this method, by which a part of electric charge is injected in the interior of the sensor, the photoresponse is significantly deteriorated.

Further, in the case of the electrostatic induction type transistor, it was difficult to have uniform multiplication factors at a same value for different pixels, because an amplifying portion was integrated in each of the pixels.

On the other hand, in the example in which an amorphous semiconductor is used, since it is possible to form a homogeneous layer at a relatively low temperature and in addition the layer has a high resistivity, advantages can be obtained that no complicated pixel separation process as for crystalline Si is needed to realize a high resolution characteristic. However, for a photosensitive element, to which the avalanche multiplication phenomena in amorphous semiconductor are applied, there still remain several problematical points.

That is, by the method which a $p^+\pi p\, n\, n^+$ structure identical to that adopted for an avalanche diode made of a crystalline semiconductor is formed using amorphous Si in order to amplify signals, a signal light is projected through the $p^+$ region in the $\pi$ region, where it is absorbed and converted into electric charge, which is in turn led to the p-n junction portion, and the avalanche multiplication takes place in the depletion layer of the p-n junction portion. In order to cause the avalanche multiplication, it is necessary that electric charge travels over a distance longer than a certain value. The present inventors test-fabricated the structure stated above using amorphous Si, and confirmed that since localized states existing in the forbidden band were more numerous for amorphous Si than for crystalline Si, the depletion layer in the p-n junction portion did not satisfactorily extend, resulting in insufficient avalanche multiplication effect. Further, it was recognized that when the operating temperature exceeded room temperature, dark current was increased, and it was not possible to apply an electric field thereon, which was so high that a sufficient avalanche multiplication effect could be obtained. These results indicate that there was a problem that no satisfactorily high amplification factor could be obtained only by forming an avalanche diode structure similar to that in crystalline Si by using amorphous Si.

In solid-state photoconductive devices of laminated photoconductive layer type such as photocells and one dimension image sensors among the prior art devices, an electrode having such contact as to block the charge injection is usually used with respect to the photoconductive layer in order to attain fine photo response. However, it has heretofore been impossible to realize a device which is capable of extracting the signal charge exceeding the number of carriers generated by the incident light. That is to say, the gain of photoelectric conversion was below unity.

As targets for photoconductive image pick-up tubes, so-called targets of blocking type described in JP-A-49-24619, for example, and so-called targets of injection type are used. The target of blocking type has such a structure that charge injection from the signal electrode side and the electron beam scanning side is prevented. The target of injection type has such a structure that the charge is injected from the signal electrode side and/or the electron beam side. The target of blocking type has a feature that the lag can be reduced. Because of absence of multiplying function at the photoconductive layer, however, a highly sensitive target of blocking type having a gain larger than unity has not heretofore been obtained.

On the other hand, more electrons than incident electrons can be introduced into an external circuit in accordance with the principle of the target of injection type. Accordingly, there is a possibility of increasing the sensitivity so as to attain a gain larger than unity. A highly sensitive image pick-up tube using a monocrystalline semiconductor target plate of np structure has already been proposed in JP-A-43-18643 (published on Aug. 13, 1967). There has also been proposed a highly sensitive image pick-up tube having an electron injection and recombination layer at the beam scan side of the photoconductive layer in order to inject scanning electrons and recombine scanning electrons with holes (JP-A-62-2435, laid-open on Jan. 8, 1987 corresponding to Japanese Patent Application No. 60-140228, filed on Jun. 28, 1985).

In accordance with any of the above-described techniques having a high sensitivity or a target of an image pick-up tube of photoconductive type to attain the gain larger than unity, however, a part of scanning electrons is injected into the target of the image pick-up tube. In principle, therefore, the effective storage capacitance of the target is disadvantageously increased and hence the lag is increased.

The image pick-up tube having a semiconductor target plate described in the aforementioned JP-A-43-18643 must satisfy the condition $T_t < T_n \leq T_e$, where $T_t$ represents the average scanning time required for scanning electrons which have reached a p-type monocrystalline semiconductor layer to reach a signal electrode through a n-type monocrystalline semiconductor layer, and $T_n$ and $T_e$ represent the average life of electrons in the p-type monocrystalline semiconductor layer and scanning time required for the scanning electron beam to scan one picture element, respectively. In addition, it is difficult to obtain a monocrystalline semiconductor substrate of good quality. In case Si single crystal is used as the monocrystalline substrate, the resistivity of the substrate is low and hence the np structure must be separated in the mosaic form as described in the above-described JP-A-43-18643. It was not desirable in raising the resolution of the image pick-up tube.

SUMMARY OF THE INVENTION

An object of the present invention is to provide a photoconductive device (photoelectric conversion device) having raised sensitivity and an operation method for such a device.

Another object of the present invention is to provide a photoconductive device having a photoelectric conversion gain larger than unity and an operation method for such a device.

A further object of the present invention is to provide a photoconductive device having a fine photo response and an operation method for such photoconductive device.

A further object of the present invention is to provide a photoconductive device having a uniform photoconductive layer which can be easily increased in area and provide an operation method for such a photoconductive device.

A further object of the present invention is to provide a photoconductive device which can be easily fabricated and an operation method for such a photoconductive device.

A further object of the present invention is to provide a photoconductive device having a small dark current and an operation method for such photoconductive device.

A further object of the present invention is to provide a photoconductive device which is not liable to sticking and provide an operation method for such a photoconductive device.

A further object of the present invention is to provide a photoconductive device having a photoconductive layer which is not liable to defects and provide an operation method for such a photoconductive device.

A further object of the present invention is to provide a photoconductive device having a good photoresponse, resolving the problematic points of the various techniques described previously.

Another object of this invention is to provide a photoconductive device made of amorphous semiconductor, which has a good thermal stability and whose photoelectric conversion efficiency is greater than 1.

Still another object of this invention is to provide a photoconductive device, for which a uniform photoelectric converting portion having a larger area can be easily formed.

Still another object of this invention is to provide a photoconductive device, which can be fabricated by a simple process.

In order to achieve the above-described objects, according to a first aspect of the present invention, an amorphous semiconductor layer capable of charge multiplication is used in at least a part of a photoconductive layer (photoelectric conversion layer) of a photoconductive device (photoelectric conversion device), which layer has a structure of charge injection blocking type.

Further, according to the present invention, within the above-described amorphous semiconductor layer, the above-described photoconductive layer is operated in an electric field region fulfilling the above-described charge multiplication function.

In order to further achieve these objects, in a second aspect of the present invention, a photoconductive device is characterized in that it comprises a substrate; a first electrode formed on said substrate; a photoconductive layer for converting incident light into signal carriers, being formed on said first electrode, and having an amorphous semiconductor layer which is made mainly of at least one first element belonging to tetrahedral system and contains at least one second element selected from an element group consisting of hydrogen and halogens; a means for applying electric field to said photoconductive layer, making said carriers run through said photoconductive layer and multiplying said carriers in said amorphous semiconductor layer.

According to this second aspect of the present invention, it is possible to obtain a photoelectric conversion device having a high sensitivity with a photoconductive gain greater than 1 and good thermal stability without reducing the excellent photoresponse of a photosensitive element using a photoconductive layer of blocking type structure.

With those and other objects in view, the invention consists in the construction and the methods hereafter fully described, illustrated in the accompanying drawings, and set forth in the claims hereto appended, it being understood that various changes in the operation, form, proportion and minor details of construction, within the scope of the claims, may be resorted to without departing from the spirit the invention or sacrificing any of the advantages thereof.

DESCRIPTIONS OF THE PREFERRED EMBODIMENTS

The present inventors found that charge multiplication (avalanche effect) occurs inside the amorphous semiconductor layer when a strong electric field is applied to the amorphous semiconductor layer. Such charge multiplication in an amorphous semiconductor has been confirmed by the present inventors for the first time.

Figure 3:
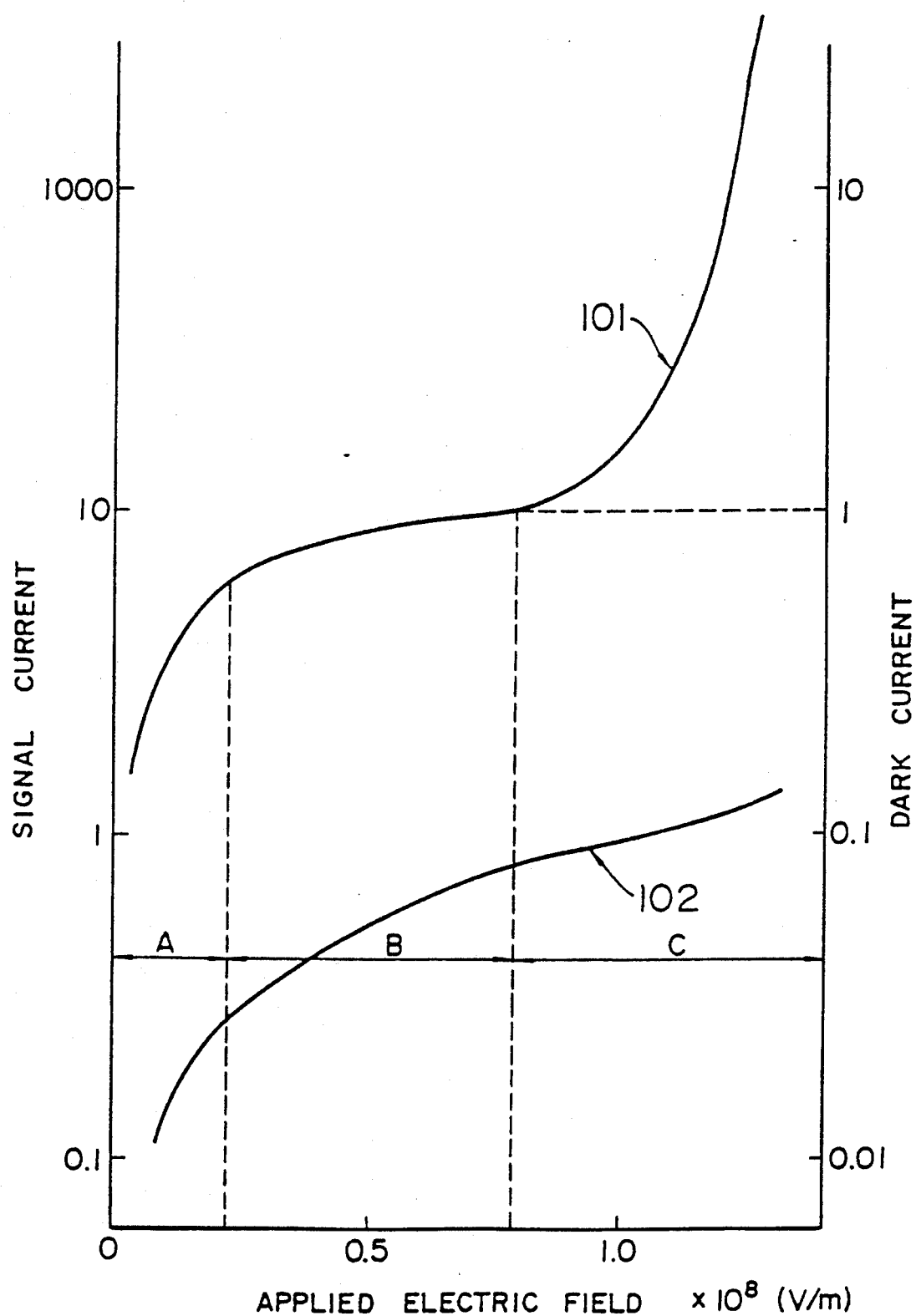
FIGS. 3, 4, 5, 6, 7 and 8 are drawings used for explaining the characteristics of a photoconductive device according to the first aspect of the present invention.

Prior to explaining the embodiments of the present invention, the charge multiplication in the amorphous semiconductor layer of a photoconductive device according to the present invention will first be described by referring to FIG. 3. FIG. 3 shows the output signal current of a photoconductive device as a function of the applied field (curve 101) and shows the dark current as a function of the applied electric field (curve 102), when a transparent electrode, a thin ceria layer, an amorphous Se layer and an Au electrode are successively piled up on a transparent glass substrate of the photoconductive device. FIG. 3 shows the relation between the optical signal current and the applied voltage and the relation between the dark current and the applied voltage, when the light is radiated onto the photoconductive device from the glass substrate side under the state that voltage is applied to electrodes so that the transparent electrode will be positive with respect to the Au electrode. The applied voltage is represented by the electric field strength.

The ceria layer located between the transparent electrode and the amorphous Se layer functions to prevent the hole injection. And the number of electrons injected from the Au electrode to the amorphous Se layer is very small. As a result, the present photoconductive device operates as the so-called photoconductive device of blocking type. As evident from FIG. 3, the relation between the signal current and the applied voltage can be divided into three regions A, B and C.

Figure 4:
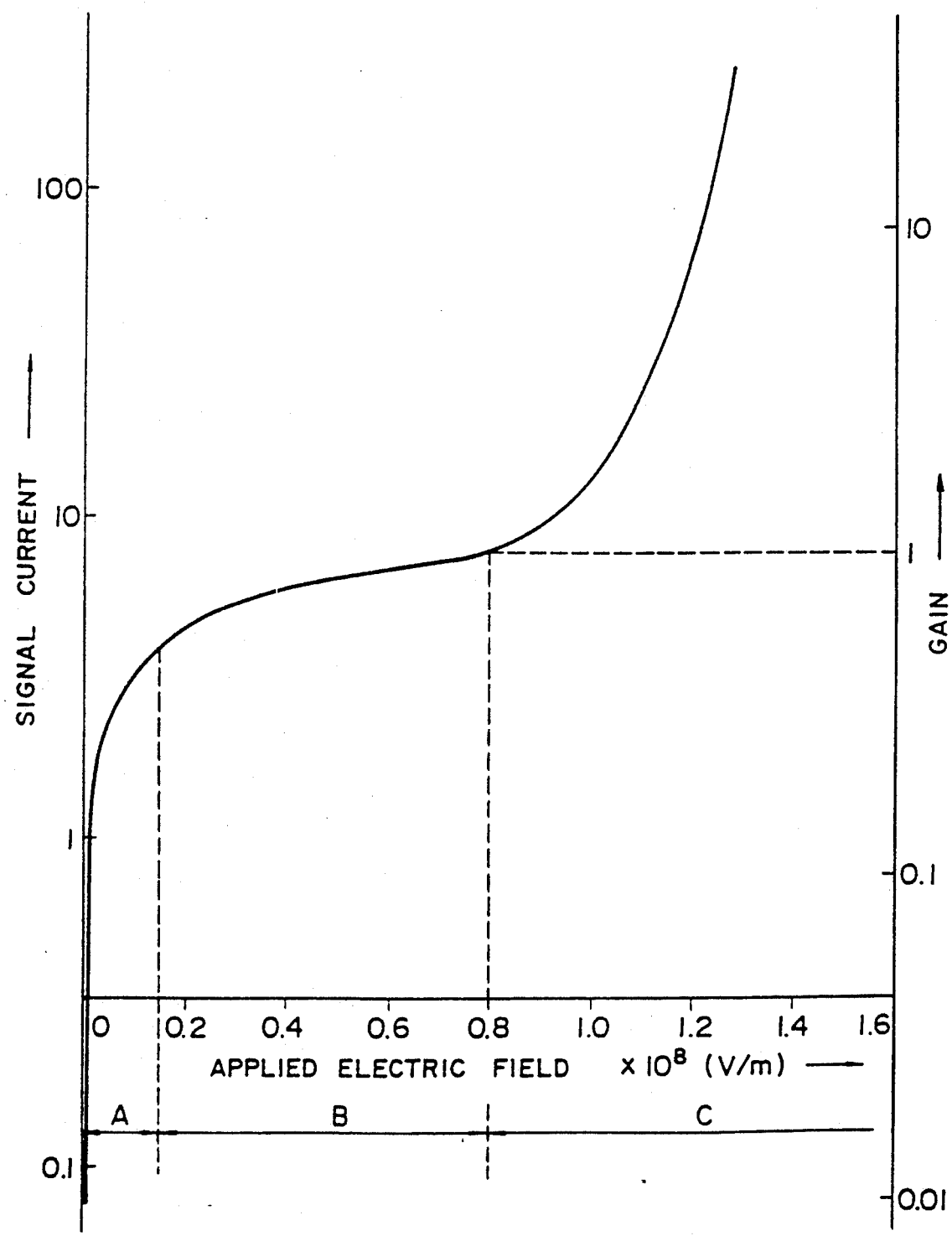

FIG. 4 shows an example of the above described charge multiplication examined for the target of a photoconductive image pick-up tube. FIG. 4 shows the relation between the output signal current and the target voltage of a target of an image pick-up tube derived by successively depositing a transparent conductive layer, a thin ceria layer, an amorphous Se layer and a $Sb_2S_3$ layer on a transparent glass substrate. FIG. 4 shows the relation between the optical signal current and the applied voltage derived when the light is radiated from the glass substrate side under the state that voltage is so applied to the target that the conductive layer will have a positive potential as compared with the $Sb_2S_3$ layer. The target voltage is represented by the electric field strength.

The ceria layer prevents the hole injection. Further, the $Sb_2S_3$ layer prevents scanning electrons from flowing into the amorphous Se. Accordingly, the target of the present image pick-up tube functions as the so-called blocking type target. As evident from FIG. 4, the relation between the signal current and the applied voltage is composed of three regions A, B and C in the target of this photoconductive image pick-up tube as well.

The region C of FIG. 3 or 4 is the operation region used by the photoconductive device according to the present invention. Prior to description of the operation region C, other operation regions A and B will now be described.

Figure 2:
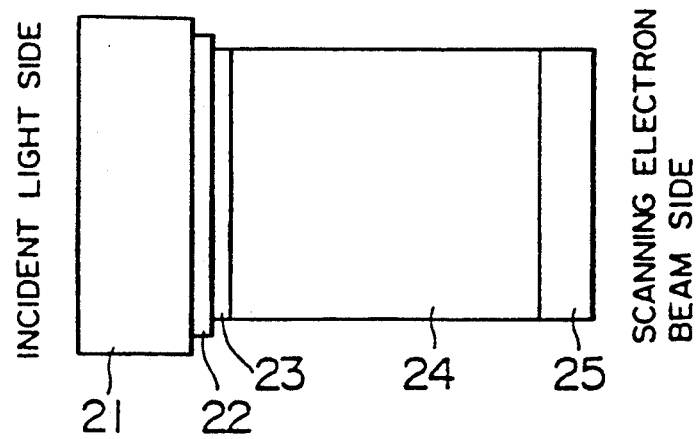
FIG. 2 shows an example of structure of a photoconductive device according to the first aspect of the present invention.

At first, the operation of the region A will now be described. Incident photons which have been passed through a transparent substrate 21, a transparent electrode 22 and an auxiliary rectifying-contact layer 23 of FIG. 2, for example, generate electron-hole pairs in an amorphous semiconductor layer 24. FIG. 2 shows an example of structure of a photoconductive device according to the present invention. When the applied electric field is increased from zero, the generated electron-hole pairs are partly separated. The resultant electrons proceed to the transparent electrode 22 and the holes reach the blocking layer 25. At this time, probability of separation of the electron-hole pairs becomes greater as the electric field is increased. Therefore, as the applied electric field is increased in strength as shown in FIG. 3, the signal current increases. The operation of the region A has heretofore been described. In the operation of the region A, the number of the electron-hole pairs generated in the amorphous semiconductor layer 24 is always less than the number of the incident photons. The gain of the photoconductive layer does not exceed unity. In this case, it is a matter of course that amplification is absent in the photoconductive layer.

Succeedingly, the operation in the region B will now be described. If the electric field of the photoconductive layer 24 shown in FIG. 2 becomes strong enough to separate most of electron-hole pairs generated by the incident photons and make electrons and holes proceed respectively to the transparent electrode 22 and the electron injection blocking layer 25 without recombining them, the signal current tends to be saturated. Even if the electric field is further strengthened, the signal current does not largely increase. The operation of the region B has heretofore been described. In the operation of the region B, recombination is reduced as compared with the operation of the above described Region A. However, the number of electron-hole pairs generated in the amorphous semiconductor layer 24 is always smaller than the number of incident electrons. Accordingly, the gain of the photoconductive layer is unit even at its maximum value. That is to say, amplification at the photoconductive layer is absent in case of the region B as well. The blocking type target described before under the heading "BACKGROUND OF THE INVENTION" is operated in the region B just described.

The region C which is an operation region of the photoconductive device according to the present invention will now be described. The present inventors found that when the applied electric field is further strengthened from the abovedescribed region B, charge multiplication occurs in the amorphous semiconductor layer 24 of FIG. 2 and the signal current abruptly increases, resulting in the gain not less than unity. The first aspect of the present invention is directed to raising the sensitivity of the photoconductive device utilizing the effect of charge multiplication caused in the above-described region C.

Figure 5:
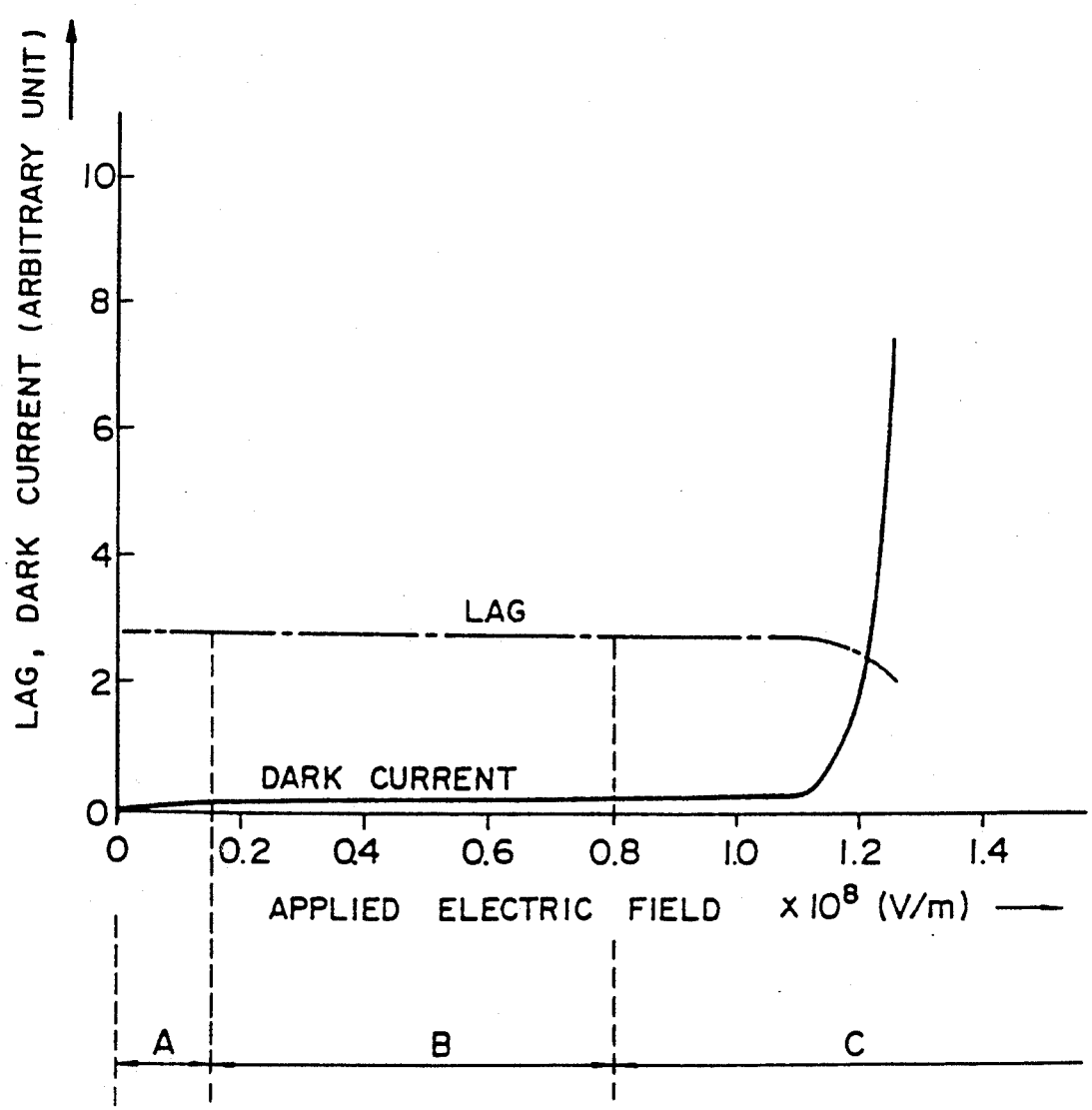

Physical interpretation of the charge multiplication caused in the operational electric field of the region C is not sufficient yet. In FIG. 5 which shows the relation of the present embodiment between the applied electric field, dark current and lag, the lag increase in the region C of the present invention having a gain not less than unity is not perceptible at all as compared with the region B. In the region C as well, the dark current does not increase largely excepting a part of the region C where the gain extremely increases. Therefore, it is evident that the charge multiplication in the photoconductive device according to the present invention is not the multiplication caused by the charge injection as described before under the heading "BACKGROUND OF THE INVENTION" but unknown multiplication caused when a strong electric field is applied to a blocking type photoconductive layer using an amorphous semiconductor.

As described above, an electric field corresponding to the region C is applied to the photoconductive layer of a photoconductive device having a structure as shown in FIG. 2, for example. If the light is radiated from the side of the transparent substrate 21 under that state, a greater part of the incident light is absorbed mainly at the side of the transparent electrode 22 of the amorphous semiconductor layer 24 to generate electron-hole pairs. Among these, electrons flow to the side of the transparent electrode 22. However, holes run in the amorphous semiconductor layer 24 toward the electron injection blocking layer 25. By providing the amorphous semiconductor layer 24 with such thickness that charge multiplication is caused to attain desired characteristics when holes run under the high electric field in the amorphous semiconductor layer 24, therefore, it is possible to obtain high sensitivity with a gain larger than unity while maintaining the low lag property of the photoconductive layer of the photoconductive device.

In case of crystal semiconductors, such charge multiplication is already known as avalanche multiplication phenomenon. The crystal semiconductor has problems that microplasma is caused and the dark current is as large as $10^{-9}$ A/mm$^2$. In addition, the dark current cannot be restricted to a low value when the sectional area of the device is large. Therefore, the crystal semiconductor has not heretofore been put into practical use as a two dimensional photoelectric conversion device for image pick-up tubes or the like. On the other hand, an amorphous semiconductor usually has many internal defects. Therefore, it has been considered that such phenomenon does not occur in the amorphous semiconductor. In fact, multiplication phenomenon in the amorphous semiconductor has not been disclosed until now. As a result of detailed study by the present inventors, however, it has been found that charge multiplication exists in the amorphous semiconductor and its dark current does not exceed one hundredth that of the crystal semiconductor despite its large area.

As a result of further detailed study, the present inventors found that charge multiplication is slight for electrons while it is significant for holes. The usual photoconductive image pick-up tube is a device using an operation scheme in which holes run within a photoconductive layer. If the above described phenomenon in the amorphous semiconductor is used in a photoconductive image pick-up tube, therefore, it is possible to amplify charges with low noise and good efficiency. For amorphous semiconductors, it is easy to form a thin film having uniform quality and a large area and it is possible to form the target portion of the image pick-up tube by using a simple process. The photoconductive device according to the present invention using an amorphous semiconductor material and its operation method are extremely effective.

Figure 12:
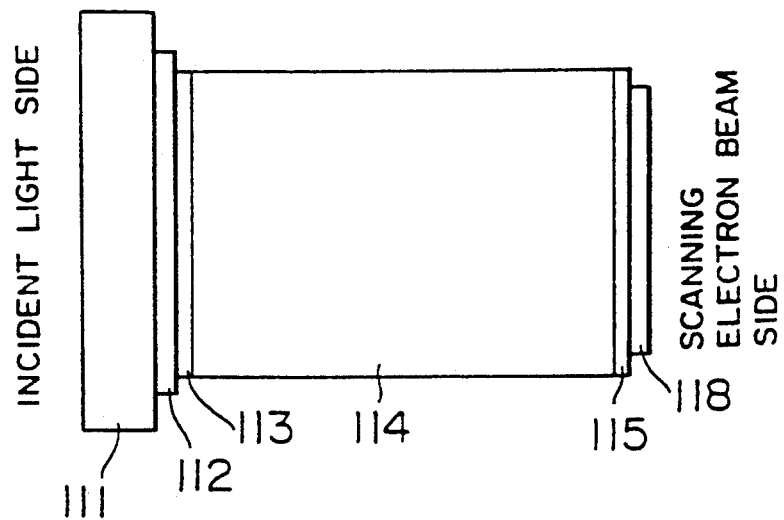
FIG. 12 shows an embodiment of a photoconductive device according to the first aspect of the present invention.

FIGS. 2 and 12 show examples of structure of photoconductive devices according to the first aspect of the present invention. Substrates 21, 111, electrodes 22, 112 and photoconductive layers 24, 114 having an amorphous semiconductor layer are illustrated respectively. The photoconductive layers 24, 114 are constructed such that rectifying contact is provided between the photoconductive layers 24, 114 and the transparent electrodes 22, 112 so that injection of the holes from the transparent electrodes 22, 112 are prevented. Although not required when the photoconductive device is used as an image pick-up tube, a pairing electrode 118 may be required as shown in FIG. 12 in other applications of the photoconductive device.

Further, it is also important for the present invention to provide electron injection blocking layer 25, 115 in order to block injection of electrons.

In case sufficient rectifying contact is not obtained between the electrodes 22, 112 and the photoconductive layers 24, 114, it is also effective to insert auxiliary layers 23, 113 rectifying contact between the to enhance the rectifying contact function.

The present invention will now be described in detail by referring to an image pick-up tube as the embodiment.

In accordance with the present invention, charge multiplication is caused in an amorphous semiconductor layer capable of charge multiplication when strong electric field is applied to the amorphous semiconductor, and such target structure is employed to effectively cause the charge multiplication. It is thus possible to obtain an image pick-up tube having high sensitivity with gain larger than unity without increasing the lag.

Especially in case the above-described photoconductive layer is formed by an amorphous semiconductor layer mainly comprising selenium, it is possible to obtain suitable charge multiplication at least in the range of $5 \times 10^7$ V/m to $2 \times 10^8$ V/m of the electric field region causing charge multiplication.

Figure 1:
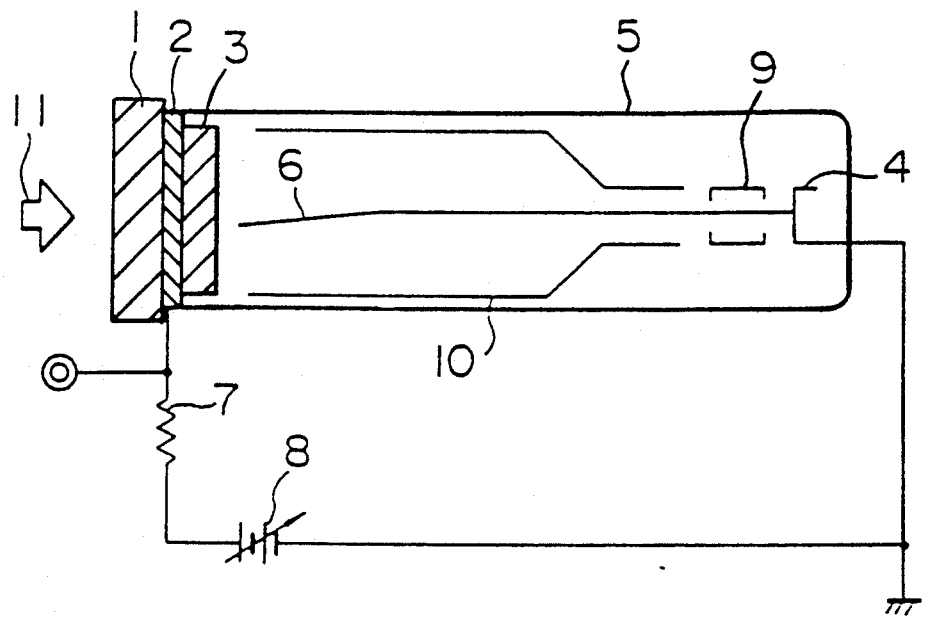
FIG. 1 shows the structure of an image pick-up tube which is an embodiment of a photoconductive device according to the first aspect of the present invention.

FIG. 1 shows an example of principle structure of an image pick-up tube according to the present embodiment.

The image pick-up tube comprises a target portion composed of a transparent substrate 11 a transparent electrode 2 and a photoconductive layer 3. And the image pick-up tube is made by hermetically sealing electrodes 4, 9 and 10 for emitting, accelerating, deflecting and focusing an electron beam 6 into the vacuum in a glass tube 5.

Electrons emitted from the cathode 4 are accelerated by voltage applied to the acceleration electrode 9 and deflected and focused by voltage applied to the deflection and focusing electrode 10. The resultant electron beam 6 scans the face of the photoconductive layer 3. In a part scanned by the electron beam, a closed circuit passing through the electron beam, the transparent electrode 2, an external resistance 7 and a power source 8 is formed. The photoconductive layer 3 is charged almost up to voltage of power source 8 in such a direction that the electron beam scanning side assumes negative potential. If light 11 is radiated under this state, the light transmitted through the transparent substrate 1 is absorbed by the photoconductive layer 3 to generate optical carriers. These optical carriers are separated by the electric field within the photoconductive layer 3 defined by the power source 8. The separated carriers run in the photoconductive layer 3. Holes among optical carriers run toward the electron beam scanning side and electrons run toward the transparent electrode 2. The potential difference between both ends of the photoconductive layer 3 which has been charged as described before is reduced. Therefore, by making the dark resistance of the photoconductive layer 3 sufficiently large, electric charge pattern is generated on the surface at the electron beam scanning side of the photoconductive layer 3 in accordance with incident light amount.

When the photoconductive layer 3 is subsequently scanned by the electron beam 6, the photoconductive layer 3 is so charged as to supplement this reduction in potential difference. The current flowing through the external resistance 7 at this time is taken out as the signal.

The above-mentioned process is common with the operation of prior art image pick-up tube of photoconductive type having a blocking type target. However, in the present invention, an amorphous semiconductor having a charge multiplication function is used at least in a portion of the photoconductive layer. If an electric field strong enough to cause the charge multiplication in the amorphous semiconductor layer is applied to the image pick-up tube of FIG. 1, the optical carriers running in the photoconductive layer 3 are strongly accelerated to have high energy and generate new electron-hole pairs by that energy. These carriers are again accelerated and increases in avalanche in the photoconductive layer. In this case, therefore, the decrease in potential difference caused by the above described process becomes larger as compared with the case of a conventional image pick-up tube where the number of carriers is not multiplied in a photoconductive layer. As a result, the current flowing during the recharging process becomes large. That is to say, high sensitivity is obtained.

If such a strong electric field as to cause charge multiplication inside the amorphous semiconductor layer is applied to the amorphous semiconductor layer, the rectifying contact, namely the hole injection blocking function or the function of blocking electron injection from the scanning beam, becomes insufficient and hence the dark current is increased, or local dielectric breakdown is caused, giving rise to a problem of raising a possibility of picture defects such as white spots on the monitor picture tube. These drawbacks can be eliminated by adding a specific material into the amorphous semiconductor layer to control the electric field distribution within the amorphous semiconductor layer as described below.

At first, the present inventors found that it was effective to put a material forming hole traps in an amorphous semiconductor layer mainly comprising Se into at least a part of the amorphous semiconductor layer for the purpose of enhancing the hole injection blocking function or restraining the occurrence of white spots. As a material forming hole traps in such an amorphous semiconductor layer, at least one selected out of a group composed of Li, Na, K, Mg, Ca, Ba and Tl as well as their fluorides, and fluorides of Al, Cr, Mn, Co, Pb and Ce, are extremely effective. The fluoride among them may be one having stoichiometric composition such as LiF, NaF, $MgF_2$, $CaF_2$, $BaF_2$, $AlF_3$, $CrF_3$, $MnF_2$, $CoF_2$, $PbF_2$, $CeF_2$, TlF or KF or one having different composition. As a result of further detailed study, such a material forming hole traps in an amorphous semiconductor layer need not necessarily be distributed with uniform concentration but may change in concentration with respect to the layer thickness direction of the amorphous semiconductor layer. Or such a material may be contained in at least a part of the layer thickness direction. Especially in case such a material is added to the light incidence side of the amorphous semiconductor layer, the electric field near the electrode interface can be lightened without hampering the charge multiplication. It has been thus made clear that such a material brings about significant effects.

It is important that the photoconductive device has a blocking-type structure, and at least one material forming hole traps in the amorphous semiconductor layer is contained in at least a part of the amorphous semiconductor layer forming at least a part of the photoconductive layer.

Figure 6:
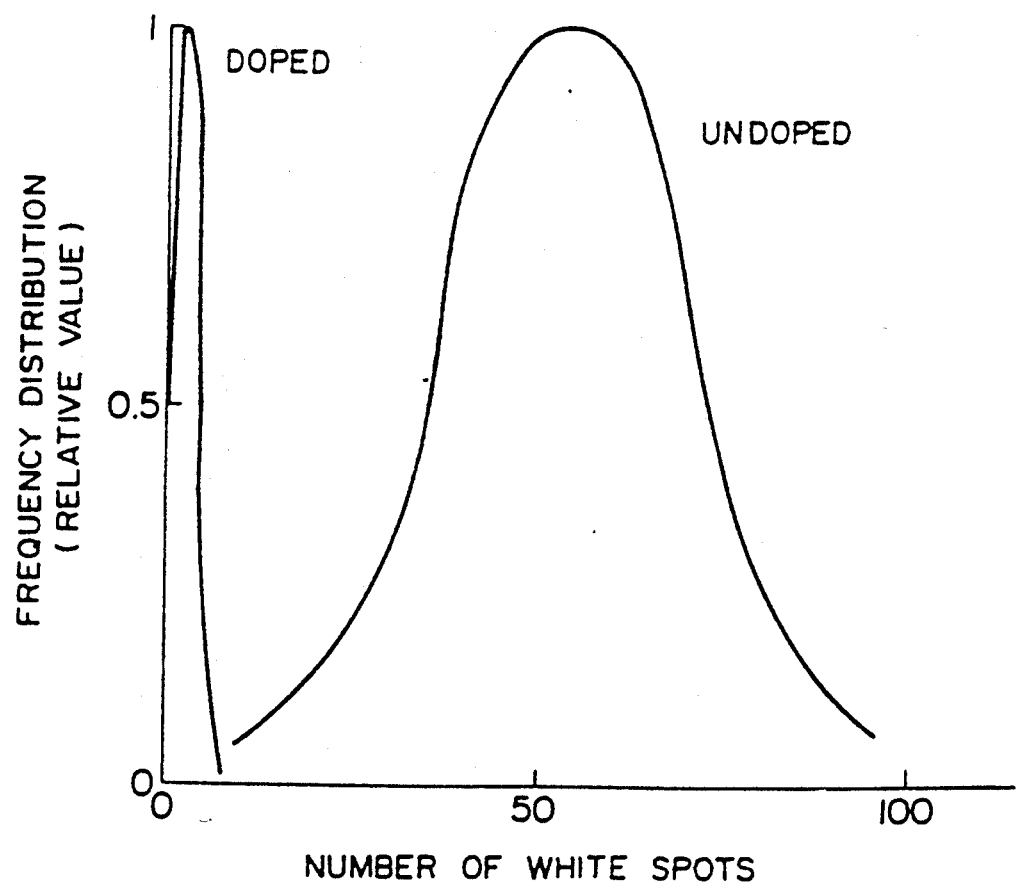

FIGS. 6 shows white spots occurrence found in a target containing 2,000 weight ppm of LiF in a part of an amorphous semiconductor layer mainly composed of Se as compared with another target with no LiF added. These white spots were generated when high voltages were applied to the image pick-up tubes having these targets to cause the charge multiplication in the amorphous semiconductor layers. It is evident from FIG. 6 that it becomes possible to control the electric field within the photoconductive layer and reduce largely the white spots occurrence rate without hampering the charge multiplication by putting LiF into at least a part of the amorphous semiconductor layer.

The effect obtained by adding the above described material forming hole traps in the amorphous semiconductor layer is not sufficient if the additive concentration is low. If the additive concentration is too high, the electric field in the above described amorphous semiconductor layer tends to vary and there is a fear of sticking. Accordingly, the local concentration of the above described additive in the layer thickness direction of the amorphous semiconductor layer is desired to be not less than 20 weight ppm and not higher than 10 weight %.

Explanation will now be presented of a means for enhancing the electron injection blocking function.

By increasing the thickness of the electron injection blocking layer in an attempt to enhance the electron scanning beam blocking function, the dark current can be made small. However, at the same time, this raises a possibility of obtaining a picture quality degradation.

It is now assumed that such strong electric field as to cause charge multiplication inside an amorphous semiconductor layer mainly comprising Se is applied to the amorphous semiconductor layer. In this case, the present inventors found that it was effective to put a material forming electron traps in the amorphous semiconductor layer into at least a part of the amorphous semiconductor layer for the purpose of enhancing the blocking function with respect to the scanning electron beam. Owing to this method, the current can be made small by increasing the layer thickness of the blocking layer at the scanning electron beam side. It is not necessary to enhance the blocking function with respect to the scanning electron beam. Deterioration in picture quality due to the increased lag is also avoided. In addition, it is possible to obtain fine dark current characteristics without hampering the charge multiplication.

As such a material forming electron traps in the amorphous semiconductor layer, at least one selected from a group consisting of copper oxide, indium oxide, selenium oxide, vanadium oxide, molybdenum oxide, tungsten oxide, gallium fluoride, indium fluoride, Zn, Ga, In, Cl, I and Br was found to be extremely effective.

The oxide and the fluoride may have stoichiometric composition like $CuO$, $In_2O_3$, $SeO_2$, $V_2O_5$, $MoO_3$, $WO_3$, $GaF_3$ or $InF_3$ or may have a composition ratio displaced therefrom.

As a result of further detailed study by present inventors, it has been made clear that significant effects are obtained when the material forming electron traps in the amorphous semiconductor layer is added near the electron beam scanning side because the electric field near the electron beam scanning side can be lightened without hampering the charge multiplication. It has also been made clear that the additive need not necessarily be distributed with uniform concentration with respect to the layer thickness direction of the photoconductive layer but may vary in concentration. If the concentration of a material forming the electron traps added to at least a part of the layer thickness direction of the amorphous semiconductor layer mainly comprising Se is low, the effect of the present invention is not sufficient. If the concentration is too high, there is a fear that sticking tends to occur.

Therefore, it is desirable that the local concentration of the material forming electron traps added to the amorphous semiconductor layer is not lower than 20 weight ppm and not higher than 10 weight % in the layer thickness direction of the amorphous semiconductor layer.

If a plurality of kinds of materials are added, the value of the additive concentration is the sum of concentrations of respective additives. It has also been made clear that the effect is further enhanced by forming a layer with at least one of As and Ge added to at least a part of the vicinity of the electron beam scanning side concurrently with adding the material forming electron traps.

TABLE 1

| Gain | Dark current (nA) | |
|---|---|---|
| | Target (I) | Target (II) |
| 5 | 0.2 to 0.3 | 10 to 13 |
| 10 | 0.3 to 3.0 | 13 to 20 |

Table 1 compares the dark current characteristics of a target (I) with those of a target (II). The target (I) contains indium oxide of 2,000 weight ppm and As of 38.8 weight % in a part of the vicinity of the electron beam scanning side of the amorphous semiconductor layer mainly comprising Se in accordance with this first aspect of the present invention. This first aspect of the present invention has not been applied to the target (II). In the ensuring description of the present invention, the concentration of the material added to the amorphus semiconductor layer is represented by a weight ratio in any case. In case this aspect of the present invention has been applied, it is evident from Table 1 that it is possible to control the electric field in the target and largely decrease the dark current without hampering the charge multiplication.

The above-described means for adding a material forming hole traps in the amorphous semiconductor layer may be combined with means for adding a material forming electron traps.

Figure 7:
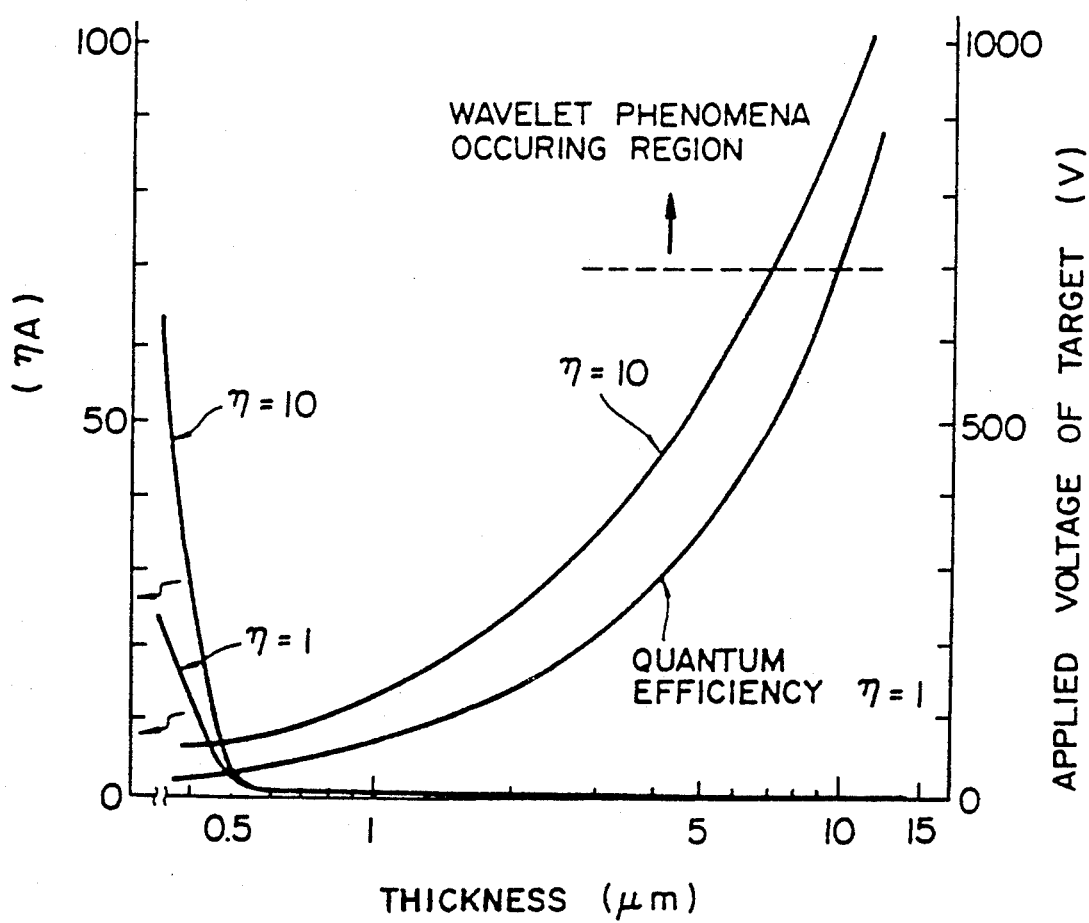

FIG. 7 shows applied target voltage which produces a gain of 1 or 10 in the target of an image pick-up tube using amorphous semiconductor layers, which mainly comprise Se and which are different from each other in layer thickness, as photoconductive layers. FIG. 7 also shows the relation between the dark current and the layer thickness derived when the target voltage is applied. It is evident from FIG. 7 that the dark current abruptly increases when the layer thickness of the amorphous semiconductor layer becomes below 0.5 $\mu$m Accordingly, the layer thickness of the amorphous layer is desired to be not less than 0.5 $\mu$m.

If the layer thickness is made large, however, the applied target voltage required to obtain a gain larger than unity also becomes high and wavelets patterns (hereafter referred to as "wavelets phenomena") tend to occur in the periphery of the screen. The abnormal phenomena tend to occur when the applied voltage is not lower than 700 V. For practical use, therefore, it is understood from FIG. 7 that the layer thickness of the amorphous semiconductor is desired to be not higher than 10 $\mu$m.

Further, a material forming hole traps in the amorphous semiconductor layer and/or another material forming electron traps may be contained in the above mentioned amorphous semiconductor to reduce the possibility of occurrence of white spots. Further, the photoconductive layer need not necessarily be a single layer of amorphous semiconductor layer. The photoconductive layer may be formed by piling up two or more kinds of amorphous semiconductor layers having a charge multiplication function, may be formed by a combination of a layer having the charge multiplication function and a layer having a photo carrier generation function or may be formed by piling up a crystal semiconductor and the above described amorphous semiconductor layer. The requisite is that the total layer thickness of amorphous semiconductor layers mainly comprising Se is not less than 0.5 $\mu$m and not larger than 10 $\mu$m when the layers function as charge multiplication layers.

In case an amorphous semiconductor material mainly comprising Se is used as the amorphous semiconductor layer, the limit of the incident light at the longer wavelength side capable of absorbing the incident light to generate optical carriers, i.e., electron-hole pairs, is defined by the energy gap of the amorphous Se. Further, in case of amorphous Se, electron-hole pairs generated by the absorbed incident light are partly recombined to disappear before they are separated by the electric field to form a signal current. This phenomenon becomes more significant as the wavelength of the incident light becomes longer. This tendency still remains even in such a strong electric field region as to cause charge multiplication in the amorphous Se layer.

Two means described below were found to be effective in solving these problems.

Figure 8:
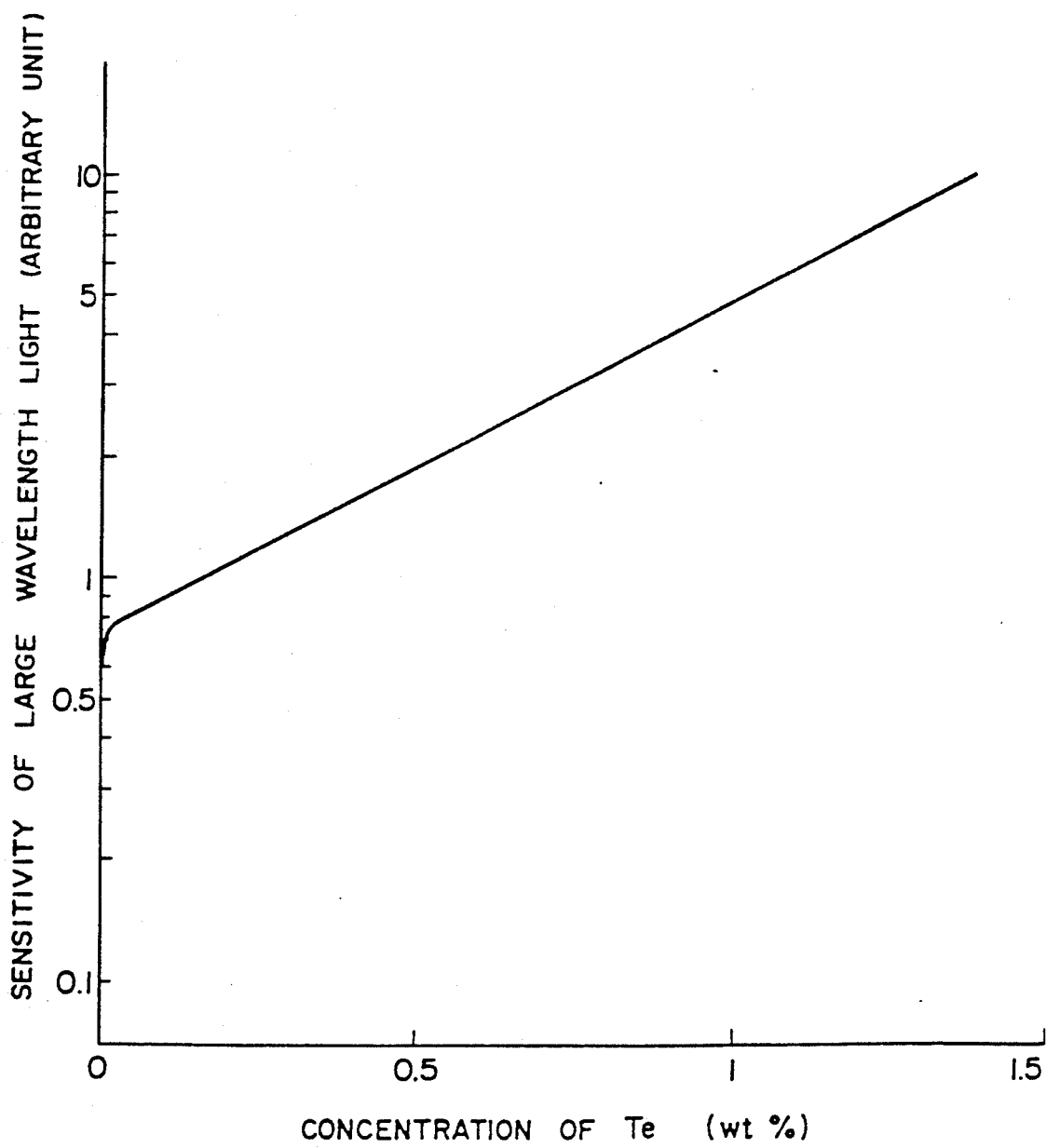

At first, the present inventors have revealed that the above described charge multiplication is maintained and high sensitivity is easily obtained for long wavelength length light as well when at least one out of Te, Sb, Cd and Bi is added to at least a part of the amorphous semiconductor layer mainly comprising Se. At this time, the concentration of the element added to the amorphous semiconductor layer mainly comprising Se need not be constant with respect to the layer thickness direction in the layer and may vary. FIG. 8 shows an example of the relation between the sensitivity for long wavelength light and the average additive concentration of Te obtained under an identical operation condition. As evident from FIG. 8, the sensitivity for long wavelength light is increased as the additive concentration of Te is increased. It is thus understood that addition of Te is extremely effective. The requisite is to add at least one of Te, Sb, Cd and Bi. Although the concentrations of the additives should be chosen according to the application of the image pick-up tube, the average value is desired to be not less than 0.1 weight %. If the additive concentration is too high, however, the electric field at the blocking contact part becomes strong and hence the dark current is increased, fine characteristics desirable for the image pick-up tube being not attainable. It is desirable that the average value of concentrations of additives is not larger than 50 weight %. For the purpose of obtaining stable rectifying characteristics, the above described additive is desired not to be added to a part of the electrode interface of the photoconductive layer 3 as shown in FIG. 1 at the light incidence side provided that the photoconductive layer 3 consists of only an amorphous semiconductor layer mainly comprising Se.

As the second means for solving the above described problem, the present inventors disclose means disposing a new optical carrier generation layer different from the amorphous semiconductor layer adjacent to the amorphous semiconductor layer in the photoconductive layer, instead of providing the amorphous semiconductor layer itself with both charge generation function and charge multiplication function. If the incident light is absorbed in the above described optical carrier generation layer to generate a greater part of optical carriers and those optical carriers are led to the amorphous semiconductor layer to be multiplied in the amorphous semiconductor layer, carriers disappearing in the amorphous semiconductor layer due to direct recombination of free electrons with free holes are very few. It is thus possible to solve the above described problem of degradation in efficiency caused by the recombination of optical carriers within the amorphous semiconductor layer. Owing to this means, it is possible to establish the spectrum sensitivity characteristics agreeing with the application of the image pick-up tube by selecting the material of the optical carrier generation layer according to the object.

In case of amorphous Se, for example, a uniform thin film can easily be formed on an arbitrary optical carrier generation layer by the vacuum deposition method. The photoconductive layer having amorphous Se as the charge multiplication layer is extremely effective as the target of an image pick-up tube.

If the optical carrier generation layer is disposed at this time at the transparent electrode side with respect to the amorphous Se charge multiplication layer, most of the charges flowing into the amorphous Se become holes. Accordingly, it becomes unnecessary to consider noise components based upon running of electrons generated by the light. Thus, this disposition is further advantageous in low-noise multiplication.

Figure 9:
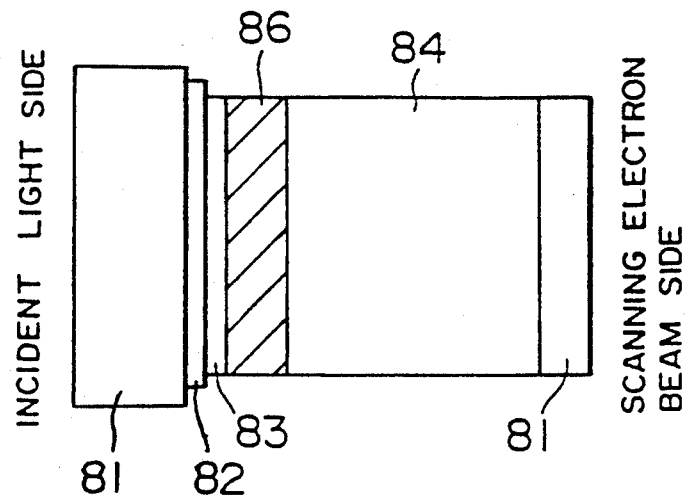
FIGS. 9 and 10 show embodiments of a photoconductive device according to the first aspect of the present invention.

FIG. 9 is a structure diagram showing the principle of the target in an embodiment of an image pick-up tube according to the first aspect of the present invention. A transparent substrate 81, a transparent electrode 82, an optical carrier generation layer 86 absorbing the light and generating charges, an amorphous semiconductor layer 84 serving as a charge multiplication layer, and an electron injection blocking layer 85 are illustrated. If rectifying contact at the interface between the transparent electrode 82 and the optical carrier generation layer 86 is not enough to present injection of holes from the transparent electrode 82 to the optical carrier generation 86, it is also effective to add an auxiliary rectifying contact layer 83 between the transparent electrode 82 and the optical carrier generation layer 86 to enhance the rectifying contact function.

It is a matter of course that the material forming the optical carrier generation layer must be large in optical absorption coefficient and photoelectric conversion efficiency. However, the material forming the optical carrier generation layer need not necessarily be an amorphous material but may be a crystal material. To be concrete, an amorphous semiconductor of chalcogenide family, an amorphous semiconductor of tetrahedral family, a compound semiconductor of III-V family, a compound semiconductor of II-VI family or their compounds, for example, can be used. In this case, it is important that the hole injection from the transparent electrode into the optical carrier generation layer is prevented under high electric field, but holes easily flow from the optical carrier generation layer into the amorphous semiconductor layer.

When carriers do not run smoothly from the optical carrier generation layer to the charge multiplication layer, it is also effective to insert an intermediate layer comprising a compound material which is different in composition from the optical carrier generation layer between the optical carrier generation layer and the charge multiplication layer to improve the carrier running property.

Figure 10:
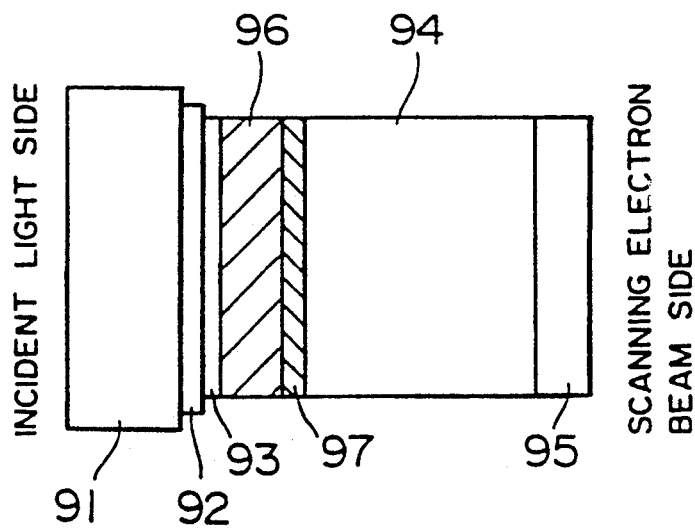

FIG. 10 is a structure diagram showing the principle of the target of an embodiment of an image pick-up tube according to the first aspect of the present invention. A transparent substrate 91, a transparent electrode 92, an optical carrier generation layer 96 absorbing the light and generating charges, an amorphous semiconductor layer 94 serving as a charge multiplication layer, and an electron injection blocking layer 95 are illustrated. If rectifying contact at the interface between the transparent electrode 92 and the optical carrier generation layer 96 is not enough to prevent injection of holes from the transparent electrode 92 to the optical carrier generation layer 96, it is also effective to insert an auxiliary rectifying contact layer 93 between the transparent electrode 92 and the optical carrier generation layer 96 to enhance the rectifying contact function in the same way as FIG. 9. FIG. 10 shows the position of the above described intermediate layer 97 from the viewpoint of principle.

It is effective to use as this intermediate layer a layer for changing the distribution of the electric field strength within the photoconductive layer by adding a material for changing the band gap such as bismuth, cadmium, or their chalcogenide compounds, tellurium or tin, or a material forming a negative space charge such as arsenic, germanium, antimony, indium, gallium, or their chalcogenide compounds, sulphur, chlorine, iodine, bromine, oxidized copper, indium oxide, selenium oxide, vanadium oxide (for example, vanadium pentaoxide), molybdenum oxide, tungsten oxide, gallium fluoride, or indium fluoride to an amorphous semiconductor layer mainly comprising Se, for example.

In any case, the object of the above described intermediate layer is to facilitate flow of electrons from the charge multiplication layer into the optical carrier generation layer and flow of holes from the optical carrier generation layer to the amorphous semiconductor layer under high electric field. The material forming the intermediate layer is not necessarily limited to the above described elements or additives.

For the purpose of changing the electric field strength within the photoconductive layer, it is also effective to form the intermediate layer by adding slightly a material capable of modulating the conductivity type such as an element of III or V family to an amorphous semiconductor layer composed of a tetrahedral material.

The present inventors further studied the optical carrier generation layer and found that two materials described below were suitable.

At first, it is now assumed that the first group comprises Zn, Cd, Hg and Pb, and the second group comprises O, S, Se and Te. If a combination of at least one element selected from the first group and at least one element selected from the second group is used as a main material of the carrier generation layer, high photoelectric conversion efficiency is obtained owing to the carrier generation layer. Since it is possible to adjust the optical band gap width and control the spectral sensitivity by changing the element combination and composition ratio, the above described combination is extremely excellent as the material of the above described optical carrier generation layer.

As the material of the optical carrier generation layer, a material mainly comprising at least one out of ZnS, CdS, ZnSe, CdSe, ZnTe, CdTe, HgCdTe, PbO and PbS, for example, is desirable.

Further, the target using CdSe, CdS, ZnCdTe, CdTe or the like in the optical carrier generation layer is suitable to image pick-up in the visible ray region and the near infrared ray region. The target using PbS, HgCdTe or the like is suitable to image pick-up in the infrared ray region. Further, the target using PbO or the like in the optical carrier generation layer is suitable to the X-ray image.

The optical carrier generation layer can be formed by means of vacuum evaporation under the state that the underlying substrate is heated or by means of sputtering under the presence of inert gas such as argon or reactive gas containing a component element. Further, it is possible to effect heating in a gas atmosphere such as $O_2$, S, Se or Te after the optical carrier generation layer has been formed.

As a result of further study, the present inventors has found that it is possible to realize an image pick-up tube having extremely high sensitivity which has been improved with respect to the problem of degradation in efficiency due to the optical carrier recombination within the above described amorphous semiconductor layer, by replacing the layer among the photoconductive layer which absorbs the incident light and generates a greater part of optical carriers with an amorphous semiconductor mainly comprising an amorphous tetrahedral material and containing at least one of F, H and Cl and by combining the amorphous semiconductor with the charge multiplication layer.

A greater part of the incident light is absorbed inside the optical carrier generation layer comprising an amorphous tetrahedral material and generates electron-hole pairs. When an amorphous tetrahedral material containing halogen such as fluorine or chlorine, or hydrogen, is used high photoelectric conversion efficiency is obtained because the internal defect can be kept extremely low. Further, it is possible to absorb the signal light efficiently with thin layer thickness because the optical band gap width can be adjusted by means of the layer forming condition, the concentration of halogen or hydrogen, mixed crystallization with a plurality of tetrahedral materials, or the like. Above all, amorphous silicon containing hydrogen is extremely excellent as the material of the above described optical carrier generation layer, because the absorption factor for the light of the visible region is high and almost all of the photons absorbed in the layer are separated into free electrons and free holes unlike amorphous Se.

In this case, the optical carrier generation layer can be formed by reactive sputtering on a tetrahedral material in the atmosphere containing halogen such as fluorine or chlorine, or hydrogen, or resolution of gas containing hydride, fluoride, or chloride of a tetrahedral element, for example.

For example, amorphous silicon containing hydrogen can be formed by using a method of keeping the underlying substrate at 100° to 300° C. and applying reactive sputtering to silicon in a mixed atmosphere of inert gas and hydrogen by using a method of resolving gas containing silicon such as monosilane or disilane with energy such as plasma discharge, light, electromagnetic wave or heat.

Further, it is also possible to obtain an amorphous silicon germanium compound having a narrower energy gap than amorphous silicon or an amorphous silicon carbon compound having a wider energy gap than amorphous silicon by sputtering silicon, germanium, or a mixture of silicon and carbide or by mixing germane containing germanium, methane containing carbon, acetylene or the like with monosilane and resolving them. It is thus possible to adjust the spectral sensitivity characteristics of an image pick-up tube.

In the same way as the foregoing case, the present invention brings about a more significant effect by inserting an intermediate layer having a varied energy band structure or varied electric field between the amorphous silicon layer and the amorphous semiconductor layer to make smooth the transfer of optical carriers from the amorphous silicon layer to the amorphous semiconductor layer.

It has also been effective to use as the intermediate layer a layer derived by adding a specific material to the above described amorphous semiconductor mainly comprising Se, a layer controlled in band gap and space charge by mixing a material capable of modulating the conductivity type such as III or V family including germanium, carbon, nitrogen or tin into an amorphous tetrahedral material, or a combination of the above described two layers.

As as result of study of the characteristics of a highly sensitive image pick-up tube comprising an amorphous Se photoconductive layer, the present inventors found that an image remained after an object which was much brighter than usual objects, for example, an object which was then thousand times or more in luminance had been photographed by the above described highly sensitive image pick-up tube operated with such high electric field as to cause charge multiplication. Hereafter, this phenomenon if referred to as highlight after image (HAI).

Figure 13:
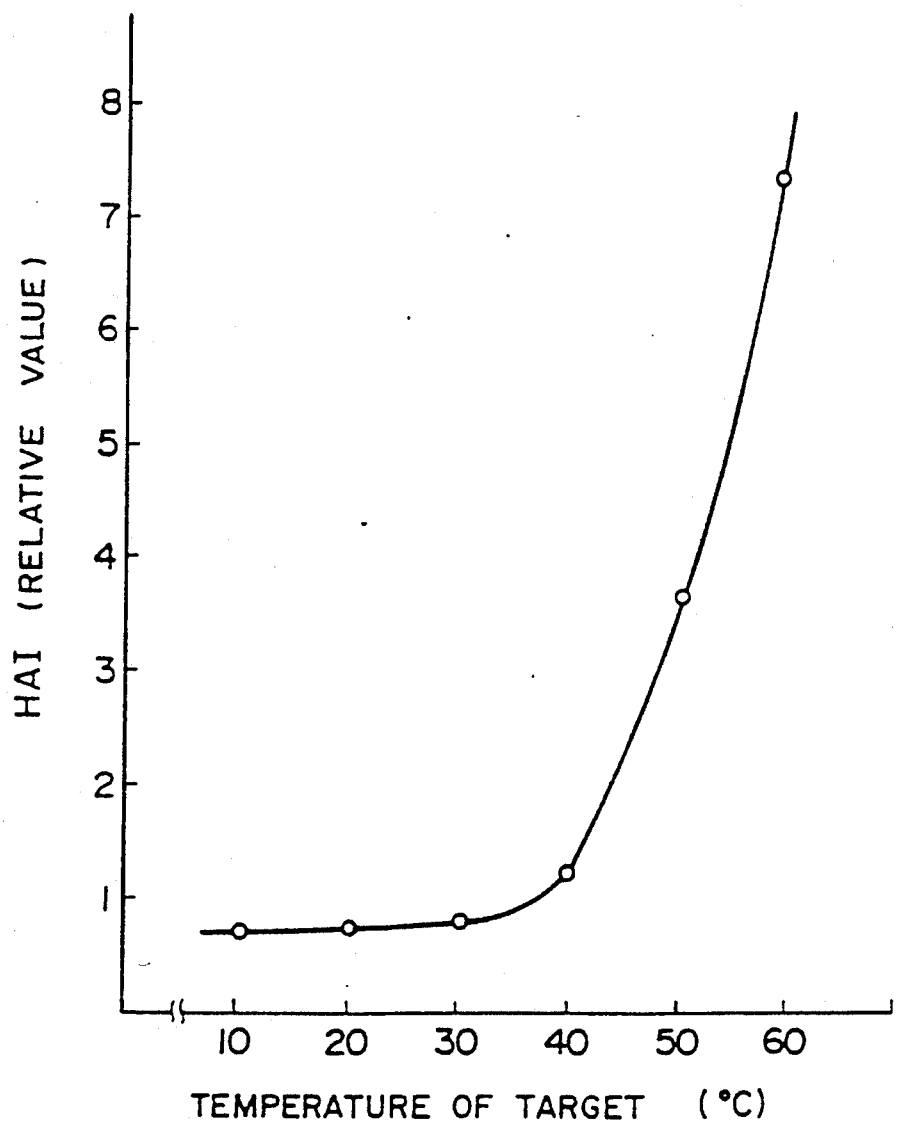
FIGS. 13, 14, and 15 are drawings for explaining the characteristics of a photoconductive device according to the first aspect of the present invention.

As a result of detailed study by the present inventors, it was found that the described HAI depended upon the temperature of the target section. It was also found that the above described phenomenon could be restrained to nearly the same level as that caused when the Se image pick-up tube was operated under a usual electric field and hence no problem was posed in practical use, provided that the temperature of the target section was kept below 40° C. FIG. 13 shows its effect.

If the image pick-up tube having a target section as shown in FIG. 2 is operated while keeping the temperature of the target section low, the HAI can be restrained as shown in FIG. 13. If the temperature of the target is kept below about 40° C., the HAI rapidly disappears and a favorable image can be obtained as evident from FIG. 13. Even if the image pick-up tube is operated with the target temperature below about 40° C., the dark current extremely advantageously tends to reduce without hampering the charge multiplication.

If it is attempted to apply such strong electric field as to cause charge multiplication inside the above described amorphous Se to the amorphous Se, there is a fear that the photoconductive layer is destroyed by the electric field before sufficient charge multiplication effect is obtained and local screen defects tend to occur.

The present inventors studied in further detail a photoconductive device using charge multiplication in an amorphous semiconductor layer mainly comprising the above described amorphous Se. As a result, it was found that the above described problems could be significantly improved by using a metal electrode comprising at least one out of Cu, Ag, Au, Al, In, Ti, Ta, Cr, Mo, Ni and Pt as the electrode on the substrate. Further, it was found that more significant effects could be obtained by inserting a single layer of cerium oxide or laminates comprising an oxide of at least one out of Ge, Zn, Cd, Al, Si, Nb, Ta, Cr and W and comprising cerium oxide between the metal electrode and the amorphous Se layer.

In case of a device structure in which the above described metal electrode is a transparent electrode and the light is applied from the substrate side to the photoconductive layer, the gain of the whole photoconductive device is reduced as much as the optical transmittivity is lowered due to the use of the semitransparent metal electrode. By using the metal electrode, however, the photoconductive device can be operated with an increased applied field. It has thus been found that a high signal current, enough to compensate the drop in gain caused by transmittivity, is obtained.

In a photoconductive device other than an image pick-up tube having such a structure that the light is applied to the device from the side opposite to the substrate as well, it is a matter of course that this metal electrode may be used. In this case, however a transparent electrode made of oxide or the like can be used as the electrode opposite to the substrate. It is thus not necessary to consider the drop in grain of the whole photoconductive device caused by the optical transmittivity of the above described electrode disposed on the substrate. The requisite is that the electrode of the substrate side is formed by the above described metal material whether the optical transmittivity may be large or not. Further, the metal electrode of the present Depending upon the application, the metal electrode may have any shape such as comb, rattan blind or island.

Figure 14:
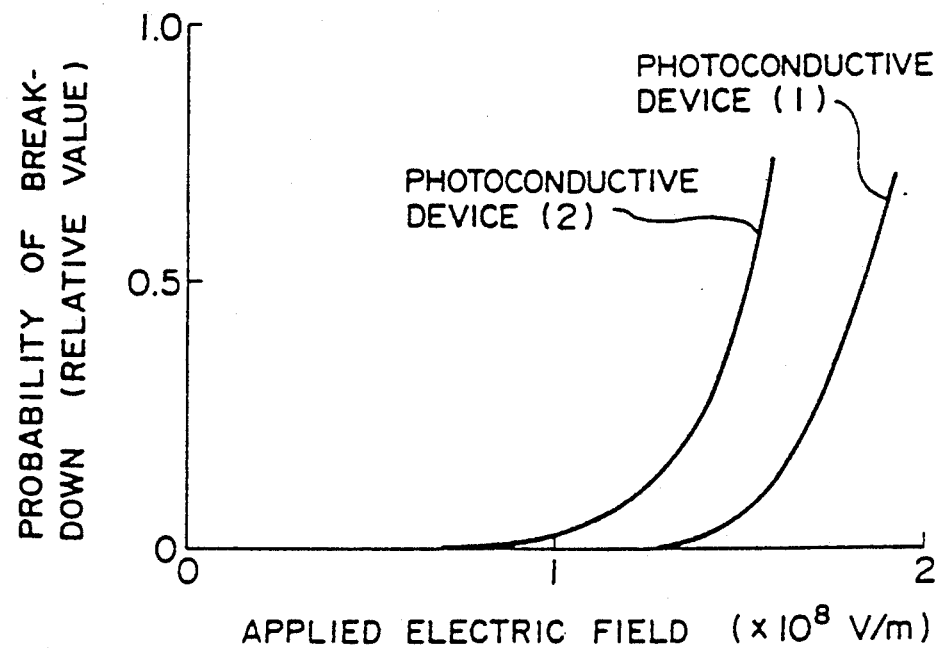

FIG. 14 shows the relation between the probability of device breakdown and the applied electric field of photoconductive devices (1) and (2) when electric field is applied to them. In FIG. 12, the photoconductive device (1) comprises transparent glass as a substrate 111, a semitransparent Ta thin film as an electrode 112, a $GeO_2$ thin film as a hole injection blocking layer 113, amorphous Se as an amorphous semiconductor layer 114, and Au as a pairing electrode 118. The photoconductive device (2) uses a transparent conductive layer mainly comprising SnO$_2$ as the electrode 112. Other components of the photoconductive device (2) are the same as those of the photoconductive device (1). It is evident from FIG. 14 that the photoconductive device (1) according to the present invention using a metal thin film as the electrode can be operated with higher electric field. Accordingly, it is understood that the photoconductive device (1) has higher sensitivity.

Figure 15:
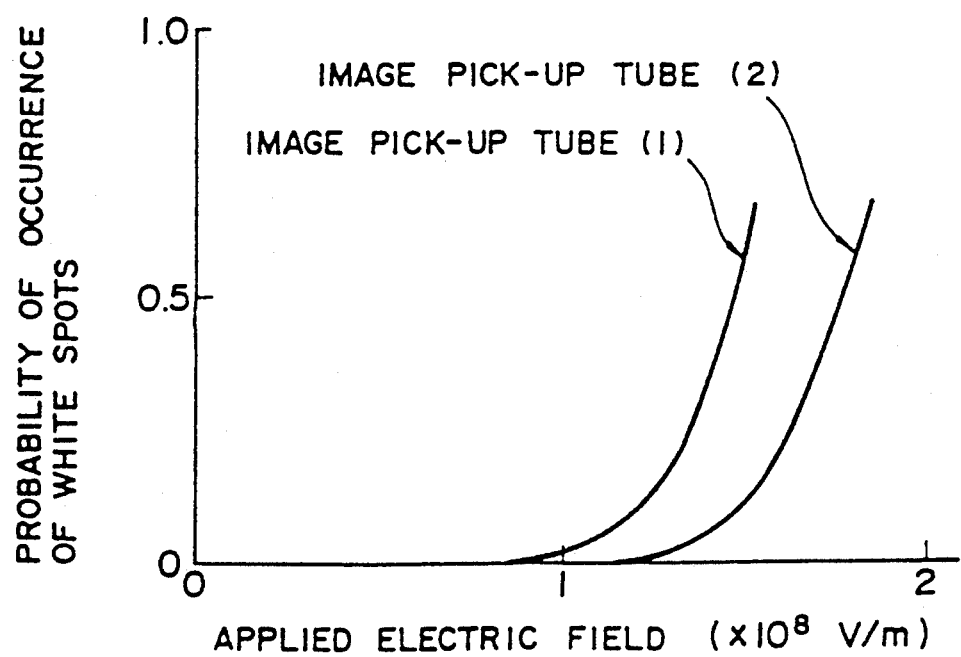

FIG. 15 is a drawing for illustrating the effect in the case of an image pick-up tube and shows the relation between the probability of occurrence of white spots and the applied electric field for a target section (1) of an image pick-up tube and a target section (2) of an image pick-up tube. The target section (1) uses a semi-transparent Cr metal thin film as the electrode 2 of FIG. 1. The target section (2) uses a transparent conductive film mainly comprising In$_2$O$_3$ as the electrode 2 of FIG. 1. In this case as well, the target section of the first aspect of the present invention can be operated with higher electric field while restraining screen defects. Accordingly, it is understood that the image pick-up tube of the present invention has higher sensitivity.

By using a metal electrode as the electrode on the substrate, it is thus possible to realize a photoconductive device capable of undergoing higher electric field and having a higher signal amplification factor.

The photoconductive device according to the present invention has heretofore been described together with various modes mainly by taking the image pick-up as examples. However, it is a matter of course that the present invention can be embodied under a combination of the above described modes. As already described, the present invention can be embodied as photoconductive devices of photocells, solid-state image pick-up devices such as one or two dimensional image sensors, or the like. Further, it is a matter of course that those photoconductive devices can be operated by an operation method of photoconductive devices according to the present invention.

Figure 11:
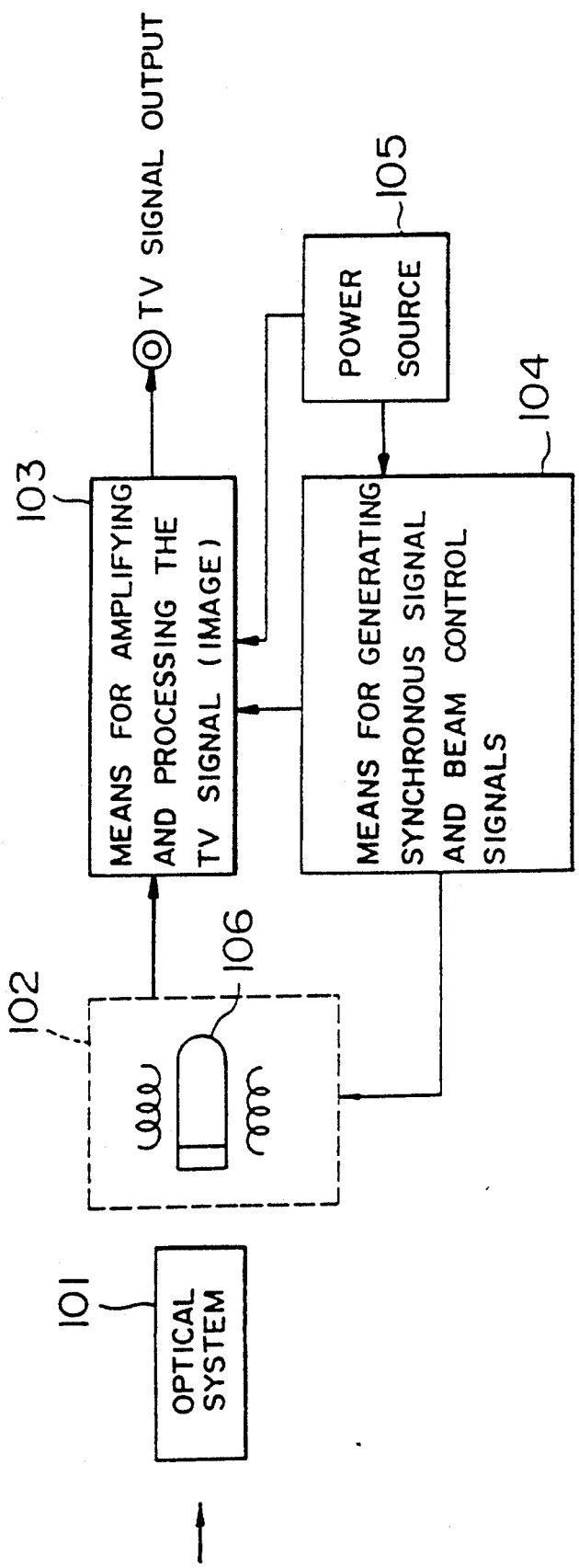
FIG. 11 shows an example of the basic configuration of a camera using a photoconductive device according to the first aspect of the present invention.

FIG. 11 shows an examle of configuration of a monochrome camera using a photoconductive device according to the present invention. As shown in FIG. 11, the camera comprises an optical system 101 for forming the optical image, a coil assembly 102 including a coil for deflecting and focusing the electron beam and an image pick-up tube, a circuit section 103 for forming a TV signal current supplied from the coil assembly and converting the TV signal current into a TV signal conforming to predetermined standards for processing, a circuit section 104 for generating synchronization signals and including a deflection and amplification circuit for defecting the electron beam, and a power source section 105.

In case of a three-tube color camera, the circuit of FIG. 11 is disposed for each of three colors R, G and B to form a parallel circuit, and a circuit section for processing the chrominance is added, as well known. By applying the present invention to cameras having a basic configuration as shown in FIG. 11, it is possible to not only realize TV images of high precision but also develop a wide variety of new TV media.

As is clear from the foregoing, use of amorphous Se having a blocking contact structure (that is, a structure which blocks carrier injection from the associated electrode) provides certain advantages in a photoconductive device. However, certain problems still remain. Thus, although use of amorphous Se having a blocking contact structure, in a photoconductive device using avalanche multiplication, has a large multiplication factor and a good photoresponse, there is a fear that the amorphous Se is altered during use; and, in particular, there is a problem that the device characteristics are unsatisfactory in high temperature operation (due to restrictions because of the material itself at, e.g., high temperatures over 80° C.).

Heretofore, it has generally been thought that charge multiplication hardly occurs in an amorphous semiconductor layer itself, because there are a number of internal defects in the layer, and it has been believed that the amorphous Se, in which charge multiplication takes place when a strong electric field is applied thereto, is an exceptional material.

The present inventors have found that materials, in which charge multiplication takes place, are not restricted to amorphous Se, but the blocking contact structure can be formed by using a tetrahedral amorphous material stated above containing hydrogen or halogens and further that the charge multiplication can be produced also mainly in the interior of a tetrahedral amorphous semiconductor layer just as in Se by adopting the blocking type structure described above and driving it while applying a high voltage to an inner region of the amorphous layer having no junction depletion region contrarily to the method by which a p-n junction is formed in such an amorphous silicon and the avalanche multiplication is made to occur in the depletion region of the junction portion. As an element of the tetrahedral system, carbon, silicon, germanium and tin can be used. By using this method, by which charge multiplication is made to take place in an amorphous semiconductor layer while applying a strong electric field to the amorphous semiconductor layer, it is possible to obtain a photoelectric conversion device having a high sensitivity with a photoconductive gain greater than 1 without reducing the excellent photoresponse of the photosensitive element having the blocking type structure.

As a result of examining these phenomena more in detail, it has been found that the characteristics are not deteriorated even for temperatures higher than 80° C., and that stability during high temperature operation is especially excellent, if a material having a forbidden band width greater than 1.85 eV is used as the tetrahedral amorphous semiconductor material forming the blocking type structure described above.

Further, it has been found that a satisfactory multiplication factor can be obtained, if the amorphous layer about 0.5 to 10 μm thick.

Figure 16A:
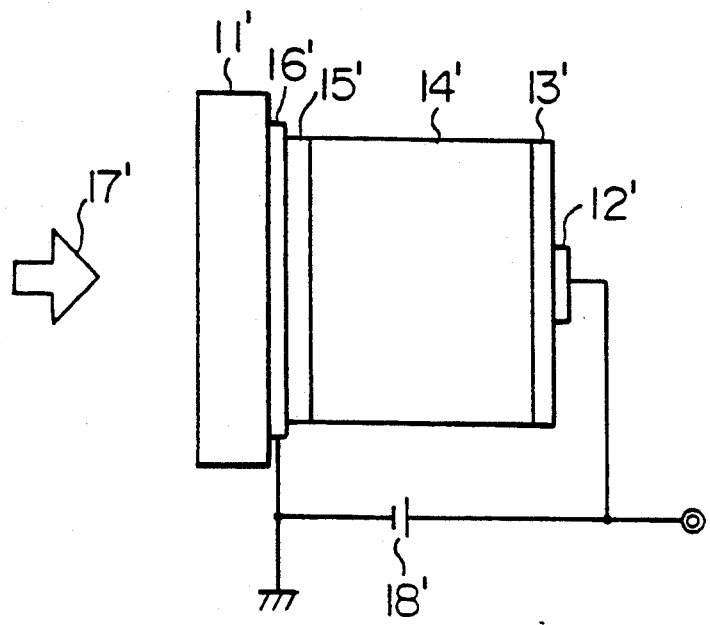
FIGS. 16A and 16B are schemes illustrating examples of the basic construction of the second aspect of the present invention.

FIG. 16A shows an example of the basic construction of a photoconductive device (photoelectric conversion device) for realizing this aspect of the present invention. A transparent substrate 11'; a transparent electrode 16', whose thickness is not greater than 300 nm; a blocking layer 15' about 5 to 500 nm thick; a photoconductive layer 14' about 0.5 to 10 μm thick containing amorphous semiconductor having the charge multiplication effect; blocking layer 13' about 5 to 500 nm thick, which prevents injection of charge carriers, whose polarity is opposite to that of those blocked by the blocking layer 15'; a counter electrode 12' and a power source 18' are fundamental portions thereof. Reference number 17' denotes an incident light. However, in this construction, the blocking layer 13' or 15' may be omitted, if a satisfactory rectifying contact can be obtained between the photoconductive layer 14' and the electrode 12' or the electrode 16'.

To the photoconductive device having the construction indicated in FIG. 16A an electric field necessary for realizing the avalanche multiplication in the amorphous semiconductor layer is applied by the power source 18'. As the inventors of this aspect of the present invention have discovered, in a device according to this aspect of the present invention, in which the amorphous semiconductor layer (although it is not shown in the figure, it must constitute at least a part of the photoconductive layer 14') is made of a material belonging to the tetrahedral system containing hydrogen or halogens and forms a blocking type structure, it is possible to apply a high electric field over the whole amorphous semiconductor layer and further to keep dark current at a value, which is smaller than 1/100 of that in a crystalline semiconductor, despite its large area.

In this state, when it is irradiated with light on the transparent electrode 6' side, incident light is absorbed within the amorphous semiconductor layer so as to generate electron-hole pairs, which travel in the directions determined by the polarity of the applied electric field, opposite to each other. Consequently, if the thickness of the amorphous semiconductor layer and the direction of the electric field are so set that charge carriers having a larger ionization ratio between photogenerated electrons and holes for the adopted amorphous semiconductor run through the amorphous semiconductor layer under the high electric field so that the charge multiplication is realized with a high efficiency, it is possible to obtain a device characteristic of operating stably with a high sensitivity with a photoconductive gain greater than 1 even for the temperature higher than 80° C., maintaining the high speed photoresponse. For example, in the construction in FIG. 16A, it is mainly electrons that travel through the photoconductive layer 14' (amorphous semiconductor layer).

Furthermore, an amorphous semiconductor can be easily formed in a homogeneous and large thin layer, and it is possible to deposit it on an arbitrary substrate, by a simple process. Consequently, from the view point that a uniform multiplication factor can be obtained, it can be understood that this aspect of the present invention is very useful.

As the tetrahedral amorphous semiconductor material, which is preferable for realizing this aspect of the present invention, compounds composed mainly of Si can be cited. These compounds have a feature that their band gap can be varied by varying fabrication conditions or the composition ratio of Si and that they are excellent in thermal stability property.

Further, the charge multiplication phenomena are observed also in amorphous materials composed mainly of the compound of carbon and silicon (silicon carbide) containing hydrogen and/or halogens. The content of the added element of hydrogen or halogens is preferably 0.5-30 at. % and more preferably 5-20 at. %. This amorphous material is more excellent in the thermal stability with respect to Se and has in general a wider forbidden band and fewer thermally excited carriers with respect to amorphous Si. For these reasons, it has a smaller increase in dark current even at the high temperature operation. Further, with the material described above, since the forbidden band width can be easily varied by varying the composition ratio of carbon and silicon, it is possible to choose a material having the forbidden band width optimum for the utilization conditions and therefore the material is extremely useful. In this way, also with an amorphous semiconductor mainly composed of silicon carbide it is possible to resolve the problem at the high temperature operation, which is characteristic to a multiplication type imaging device using amorphous Se.

The inventors of this aspect of the present invention have examined the avalanche multiplication in amorphous silicon carbide more in detail and found that amorphous silicon carbide with forbidden band width of 1.9 to 2.6 eV can be obtained for a carbon composition ratio between 5 and 50%, and in such material, avalanche multiplication occurs efficiently, and that the thickness of the amorphous silicon carbide is preferably not less than 0.5 $\mu$m in order to obtain a satisfactory multiplication factor.

Further, a small amount of elements of V family such as P, As, etc. or elements of III family such as B, Al, etc. may be added to amorphous silicon carbide for obtaining an avalanche multiplication layer. But, in this case, it is desireable to keep the resistivity at room temperature over $10^{10}$ $\mu$cm.

Figure 24:
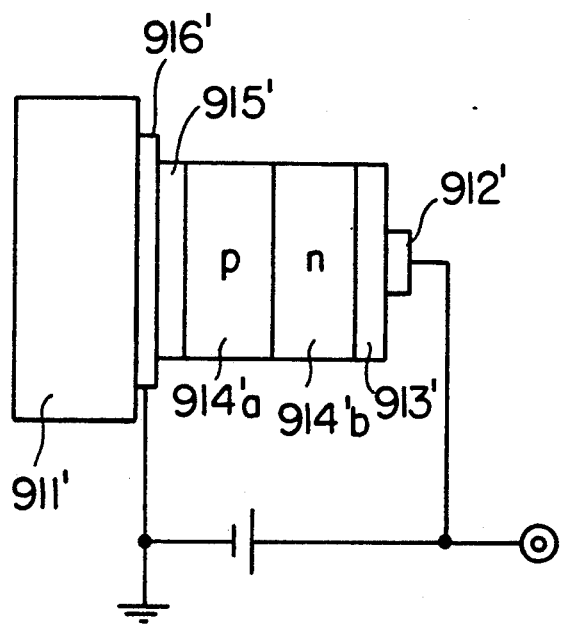
FIG. 24 is a scheme for explaining the structure of still another embodiment of the photoelectric conversion device according to this second aspect of the present invention.

Furthermore, the amorphous silicon carbide layer is not necessarily simply a homogeneous layer, but, in particular, in the case of a-SiC, a p-n junction may be formed therein, in order to have a structure, in which an avalanche multiplication can be produced efficiently in the junction portion, or the charge multiplication factor may be increased effectively by controlling the forbidden band width while varying the carbon concentration in the direction of the layer thickness. A device having a p-n junction in the amorphous silicon carbide layer is shown in FIG. 24. In this figure, 911' is a transparent substrate; 916' is a transparent electrode, 915' an electron blocking layer, 914'$a$ a p-type amorphous silicon carbide layer portion (doped with B), 914'$b$ an n-type amorphous silicon carbide layer portion (doped with P), 913' a hole blocking layer, and 912' an Al electrode.

Figure 16B:
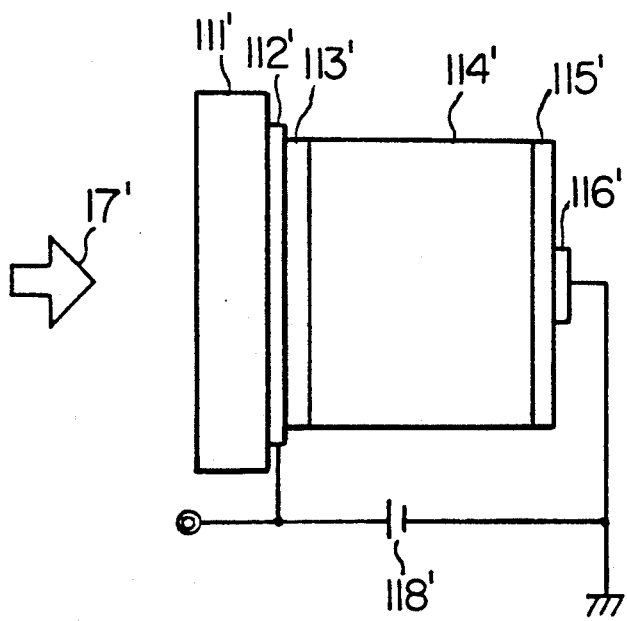

By the way, in the structures indicated in FIGS. 16A and 16B, in the case where the carrier blocking characteristic is intensified by disposing the blocking layers 13', 15', the layer described below is useful.

That is, as the hole blocking layer 13', 113', amorphous silicon carbide or silicon nitride containing at least one of hydrogen and halogens, or n conductivity type amorphous silicon carbide or silicon nitride containing at least one of hydrogen and halogens and at least one of the elements of V family such as P, As, etc., or oxide of at least one of Ce, Ge, Zn, Cd, Al, Si, Nb, Ta, Cr and W, or a combination of more than 2 of the layers described above is suitable.

Further, as the electron blocking layer 15', 115', amorphous silicon carbide or silicon nitride containing at last one of the hydrogen and halogens, or p conductivity type amorphous silicon carbide or silicon nitride containing at lerst one of hydrogen and halogens and at least one of the elements of III family such as B, Al, etc., or an oxide of Ir, or at least one of calcogenides such as $Sb_2S_3$, $As_2S_3$, $As_2Se_3$, Se-As-Te, etc., or a combination of more than 2 of the layers described above is suitable.

Here, for the silicon carbide used as the carrier blocking layer, contrarily to the silicon carbide used as the charge multiplication layer, the carbon content may be varied to a value greater than 50% depending on the sign of the carrier (i.e., electron or hole), whose injection should be blocked.

Although a photoelectric conversion device using the charge multiplication effect in a tetrahedral amorphous semiconductor layer has been described above, for an amorphous semiconductor, contrarily to a crystal, since it is possible to overlay arbitrary different materials upon one another, the photoconductive layer may be constituted not by a single layer, but together with other thermally stable amorphous semiconductor layers overlaid thereon and having a similar charge multiplication. In addition, the whole photoconductive layer is not necessarily amorphous semiconductor, but it may have a construction, in which a crystalline semiconductor layer such as Si, etc. and an amorphous semiconductor layer are overlaid on each other. Further, it may be so constructed that it is deposited on a substrate including signal reading-out circuits, etc. What is essential to this second aspect of the present invention is that there is disposed an amorphous semiconductor layer composed mainly of an element belonging to the tetrahedral system containing at least one of hydrogen and halogens as at least some of the layers constituting the photoconductive layer, and in which the charge multiplication is made to occur so as to enhance the sensitivity. Consequently, it is also possible that it is mainly the other layers in the photoconductive layer that have the function to absorb the incident light so as to produce photocarriers and that the amorphous semiconducting layer is used mainly for multiplying the carriers. In this case, there is a layer for generating photocarriers on the side, which is exposed to the incident light, in the photoconductive layer and the amorphous semiconductor layer may be made therebehind (in the direction of the propagation of the incident light).

Figure 17:
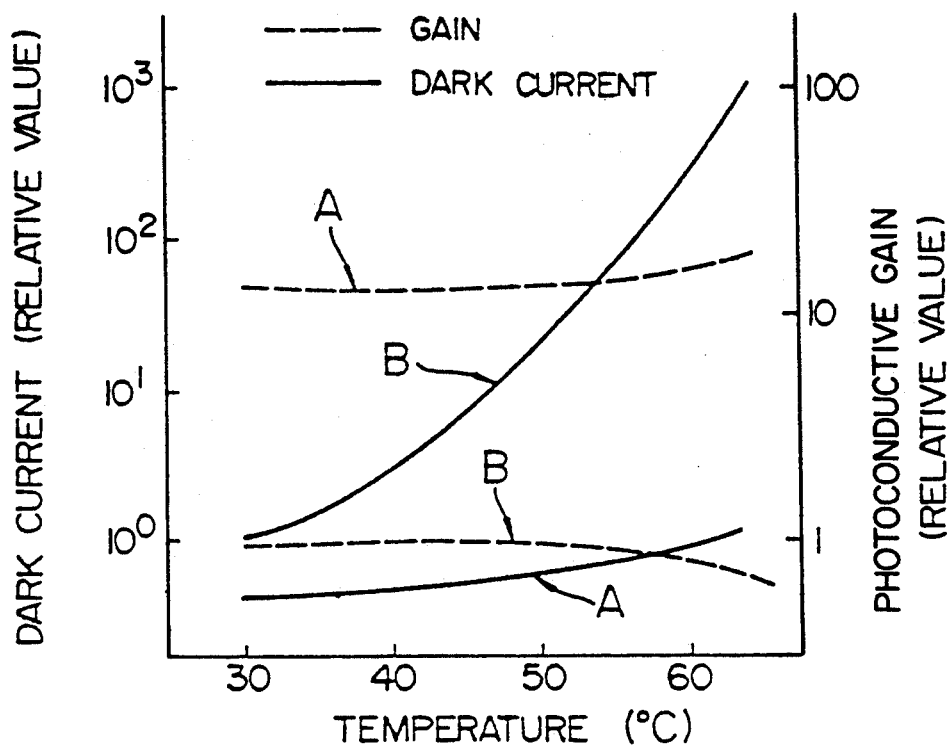
FIGS. 17 and 18 are graphs explaining characteristics and the defective fraction respectively, of a device according to this second aspect of the present invention.
Figure 18:
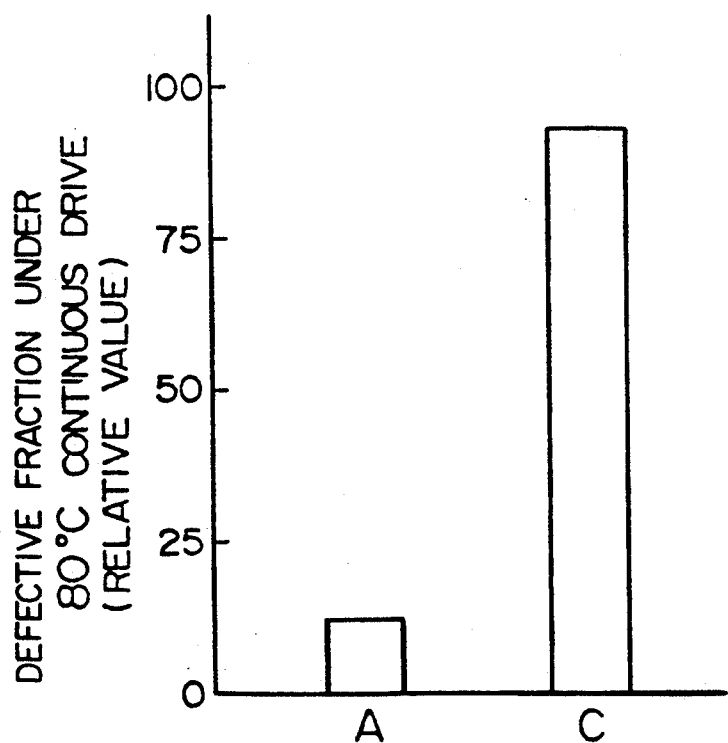

FIGS. 17 and 18 indicate effects obtained by realizing this invention. FIG. 17 indicates the temperature dependence of the dark current and the photoconductive gain when two photosensitive elements (A) of this second aspect of the present invention are driven by applying such an electric field that an avalanche multiplication can occur. Photosensitive element (A) consists of the transparent electrode 112', the hole blocking layer 113', the intrinsic amorphous silicon layer as photoconductive layer 114', the electron blocking layer 115, and Al as electrode 116' successively deposited on the transparent glass substrate 111', as indicated in FIG. 16B, and has an effective area of 1 cm$^2$, Photosensitive element (B) has a p+ πpn junction, and has an amorphous silicon layer disposed on a transparent electrode deposited on a transparent substrate and Al electrode deposited thereon, and has an effective area of 1 cm$^2$. With the photosensitive element (B), the gain is insufficient in all the temperature regions and the dark current increases significantly with increasing temperature, while both the gain and the dark current of the photosensitive element (A) have satisfactory behavior.

FIG. 18 indicates the endurance of the element (A) described above and an element (C) driven continuously for 100 hours at 80° C., the element (C) consisting of a transparent electrode, a hole blocking layer, an amorphous Se layer and an Au electrode successively deposited on a transparent substrate and having an effective area of 1 cm$^2$. The endurance of the element (A) is remarkably improved with respect to that of the element (C). In the case where silicon carbide is used as the amorphous semiconductor, effects similar to those indicated in FIGS. 17 and 18 can be obtained.

Although, in the above examples in which the avalanche effect in a thermally stable tetrahydral amorphous semiconductor is applied mainly to a photoconductive device have been described, it is a matter of course that this second aspect of the present invention can be applied as well to more general amplifying elements and switching elements apart from photoelectric conversion devices.

The photoconductive device according to the first and second aspects of the present invention and its operation method, will now be described in detail by referring to some concrete examples.

Examples 3 to 47 show examples where the first aspect of the present invention is applied to image pick-up tubes. The structure of the image pick-up tube has already been shown in FIG. 1.

EXAMPLE 1

A Cr semi-transparent electrode having thickness of 0.01 μm is formed on a quartz substrate by using the electron beam evaporation technique. On that Cr semi-transparent electrode, a GeO$_2$ thin layer and a CeO$_2$ thin layer having a total layer thickness of 0.03 μm are deposited by the evaporation technique to form a hole injection blocking layer. Further thereon, an amorphous semiconductor layer comprising Se, As and Te is formed to have thickness of 0.5 to 10 μm by the evaporation technique. Further thereon, an Al electrode having layer thickness of 0.03 μm is deposited by using the evaporation technique. As a result, a photocell is obtained.

EXAMPLE 2

A metal electrode having layer thickness of 0.2 μm and mainly comprising Au is formed on a semi-insulative semiconductor substrate by the evaporation technique. Amorphous Se is formed thereon to have thickness of 0.5 to 10 μm by the evaporation technique. Further thereon, CeO$_2$ is deposited to have thickness of 0.03 μm as a hole injection blocking layer by using the evaporation technique. Further thereon, a transparent electrode having thickness of 0.1 μm and mainly comprising In$_2$O$_3$ is formed by using the low temperature sputtering temperature. As a result, a solid-state image pick-up device is obtained.

EXAMPLE 3

A semi-transparent Ta electrode having layer thickness of 0.01 μm is formed on a glass substrate by the sputtering technique. Thereon CeO$_2$ is deposited to have thickness of 0.02 μm as the hole injection blocking layer by the evaporation technique. Thereon amorphous Se is formed to have thickness of 0.5 to 6 μm by the evaporation technique. Further thereon, Sb$_2$S$_3$ is resistance-heated and evaporated in a inert gas atmosphere of $2 \times 10^{-1}$ Torr to have thickness of 0.1 μm as the electron injection blocking layer. A photoconductive target of image pick-up tube having a blocking type structure is thus obtained. This target is incorporated into a casing of image pick-up tube containing an electron gun therein, resulting in a photoconductive image pick-up tube. The photoconductive devices of the above described EXAMPLES 1, 2 and 3 are operated in electric field not less than $8 \times 10^7$ V/M. For example, high sensitivity with gain not less than 10 is attained in the electric field of $1.3 \times 10^8$ V/m

EXAMPLE 4

A transparent electrode mainly comprising tin oxide is formed on a glass substrate. On this transparent electrode, amorphous Se is vacuum-evaporated to form an amorphous semiconductor layer having thickness of 0.1 to 6 μm. On the amorphous Se, $Sb_2S_3$ is evaporated in the inert gas atmosphere of $2\times 10^{-1}$ Torr to have thickness of 1,000 Å as the electron injection blocking layer. The target section of a photoconductive image pick-up tube having a blocking type structure is thus obtained.

EXAMPLE 5

On a glass substrate, a transparent electrode mainly comprising indium oxide is formed. On this transparent electrode, an amorphous semiconductor layer comprising Se and As or Se and Ge and having thickness of 0.1 to 6 μm is formed by the vacuum evaporation technique. When the layer is formed, Se and $As_2Si_3$ or Se and Ge are simultaneously evaporated on the substrate respectively different from boats so that the concentration of As or Ge will be 2 weight % on the average. On that layer, $Sb_2S3$ is evaporated in the inert gas atmosphere of $1\times 10^{-1}$ Torr to have thickness of 800 Å as the electron injection blocking layer. The target section of photoconductive image pick-up tube having a blocking type structure is thus obtained.

EXAMPLE 6

A transparent electrode mainly comprising indium oxide is formed on a glass substrate. Thereon, an amorphous semiconductor layer comprising Se, As and Ge and having layer thickness of 0.5 to 6 μm is formed. When the layer is formed, Se, $As_2Se_3$ and GeSe are simultaneously evaporated onto the substrate respectively from different boats so that the total amount of As and Se will become 3 weight % on the average. Further thereon, $Sb_2S_3$ is evaporated in the inert gas atmosphere of $2\times 10^{-1}$ Torr to have thickness of 800 Å as the electron injection blocking layer. As a result, the target section of a photoconductive image pick-up tube having a blocking type structure is obtained.

The target section of the image pick-up tube derived by the above described EXAMPLES 4, 5 and 6 is incorporated into a casing of the image pick-up tube containing an electron gun, resulting in a photoconductive image pick-up tube. When the resultant image pick-up tube is operated in the target electric field not less than $8\times 10^7$ V/m, the signal is amplified within the amorphous semiconductor layer. When the electric field has a value of $1.2\times 10^8$ v/m, for example, the output is obtained with a gain close to 10.

In the above described EXAMPLES 4, 5 and 6, a vacuum-evaporated layer of cerium oxide having thickness of 300 Å for example, may be inserted between the transparent electrode and the amorphous semiconductor layer as an auxiliary rectifying contact layer. In this case, the function of blocking injection of holes from the transparent electrode is enhanced. Accordingly, operation in higher electric field strength becomes possible and the sensitivity with charge multiplication factor not lower than 10 is obtained.

EXAMPLE 7

A transparent electrode mainly comprising tin oxide is formed on a glass substrate. On this transparent electrode, an amorphous Se layer is evaporated to form an amorphous semiconductor layer having thickness of 1 to 3 μm by the evaporation technique. On the amorphous semiconductor layer, $Sb_2S_3$ is evaporated in the inert gas atmosphere $2\times 10^{-1}$ Torr to have thickness of 0.1 as the electron injection blocking layer. The target section of a photoconductive image pick-up tube having a blocking type structure is thus obtained.

EXAMPLE 8

A transparent electrode mainly comprising indium oxide is formed on a glass substrate. On this transparent electrode, $CeO_2$ is evaporated to have thickness of 0.03 μm. Further thereon, an amorphous Se layer having layer thickness of 0.5 to 2 μm is formed by the vacuum evaporation technique, resulting in an amorphous semiconductor layer. On the amorphous semiconductor layer, $Sb_2S_3$ is evaporated in the inert gas atmosphere of $1\times 10^{-1}$ Torr to have thickness of 0.1 μm as the electron injection blocking layer. The target section of a photoconductive image pick-up tube having a blocking type structure is thus obtained.

EXAMPLE 9

A transparent electrode mainly comprising tin oxide is formed on a glass substrate. On this transparent electrode, $GeO_2$ and $CeO_2$ are successively evaporated to have thickness of 0.015 μm respectively. Further thereon, an amorphous Se layer having thickness of 0.02 to 0.06 μm is also formed by using the vacuum evaporation technique. Succeedingly, Se and LiF are evaporated from respective boats to form an amorphous layer having thickness of 0.02 to 0.06 μm. At this time, the concentration of LiF is defined to be 4,000 weight ppm and distributed uniformly in the layer thickness direction. Further thereon, an amorphous Se layer is so formed by the vacuum evaporation method that the total layer thickness will be 1 to 8 μm. On the amorphous Se layer, $Sb_2S_3$ is evaporated in the inert gas atmosphere of $2\times 10^{-1}$ Torr to have thickness of 0.1 μm as the electron injection blocking layer. The target section of a photoconductive image pick-up tube having a blocking type structure is thus obtained.

EXAMPLE 10

A transparent electrode mainly comprising indium oxide is formed on a glass substrate. On that transparent electrode, $CeO_2$ is evaporated to have thickness of 0.03 μm. Further thereon, an amorphous semiconductor layer comprising Se, As and LiF and having layer thickness of 0.02 to 0.04 μm is formed by the vacuum evaporation technique. When the layer is formed, Se, $As_2Se_3$ and LiF are simultaneously so evaporated from respective different boats that the concentration of As will be 3 to 6 weight % and the concentration of LiF will be 3,000 to 6,000 weight ppm on the average. Further thereon, an amorphous semiconductor layer comprising Se, As and LiF and having layer thickness of 0.03 to 0.045 μm is formed by the vacuum evaporation technique. At this time, the concentration of As is defined to be 2 to 5 weight % and the concentration of Li is defined to be 15,000 weight ppm on the average. Further thereon, an amorphous semiconductor layer comprising Se and As is so formed by the vacuum evaporation technique that the total layer thickness will be 1 to 4 μm. At this time, the concentration of As is defined to be 1 to 3 weight %. Further thereon, $Sb_2S_3$ is evaporated in the inert gas atmosphere of $1\times 10^{-1}$ Torr to have thickness of 0.1 μm as the electron injection blocking layer. The target section of a photoconductive image pick-up tube having a blocking type structure is thus obtained.

EXAMPLE 11

A transparent electrode mainly comprising indium oxide is formed on a glass substrate. On that transparent electrode, an amorphous semiconductor layer comprising Se and LiF and having layer thickness of 0.02 to 0.03 μm is formed by the vacuum evaporation technique. When the layer is formed, Se and LiF are simultaneously so evaporated from respective different boats that the concentration of LiF will be 2,000 weight ppm on the average. Further thereon, an amorphous semiconductor layer comprising Se and LiF and having layer thickness of 0.03 to 0.04 μm is formed by the vacuum evaporation technique. The concentration of LiF at this time is made to be 8,000 to 15,000 weight ppm on the average. Further, Se and Te are evaporated from respective different boats to form an amorphous semiconductor layer having layer thickness of 0.02 to 0.04 μm. At this time, the concentration of Te is defined to be 5 to 15 weight &. Succeedingly, such an amorphous Se layer is so formed by the vacuum evaporation technique that the total layer thickness will be 1 to 4 μm. Further thereon, $Sb_2S_3$ is evaporated in the inert gas atmosphere of $2 \times 10^{-1}$ Torr to have thickness of 0.08 μm as the electron injection blocking layer. The target section of a photoconductive image pick-up tube having a blocking type structure is thus obtained.

The target section of an image pick-up tube derived by the EXAMPLES 7, 8, 9, 10 and 11 is incorporated into the casing of the image pick-up tube containing an electron gun therein, resulting in a photoconductive image pick-up tube. When the resultant image pick-up tube is operated in the electric field not less than $7 \times 10^7$ V/m, the signal is amplified within the amorphous photoconductive layer. When the electric field has a value of $1.2 \times 10^8$ V/m for a target having layer thickness of 2 μm, for example, the output has been obtained with a gain larger than 10.

EXAMPLE 12

A transparent electrode mainly comprising tin oxide is formed on a glass substrate. On this transparent electrode, Se and Te are vacuum-deposited from respective different boats to have thickness of 1 to 2 μm. At this time, the concentration of Te is defined to be 0.01 weight % and distributed uniformly in the layer thickness direction. On this amorphous semiconductor layer mainly comprising Se, $Sb_2S_3$ is evaporated in the inert gas atmosphere of $2 \times 10^{-1}$ Torr to have thickness of 0.1 μm as the electron injection blocking layer. The target section of a photoconductive image pick-up tube having a blocking type structure is thus obtained.

EXAMPLE 13

A transparent electrode mainly comprising tin oxide is formed on a glass substrate. On this transparent electrode, Se and Te are vacuum-evaporated from respective different boats to have thickness of 1 to 3 μm. The concentration of Te is defined to be 0 weight % at the start of evaporation and gradually increased with the advance of evaporation so that the average concentration of the whole layer will be 0.1 weight %. On this photoconductive layer, $Sb_2S_3$ is evaporated in the inert gas atmosphere of $2 \times 10^{-1}$ Torr to have thickness of 0.1 μm. The target section of a photoconductive image pick-up tube having a blocking type structure is thus obtained.

EXAMPLE 14

A transparent electrode mainly comprising indium oxide is formed on a glass substrate. On this transparent electrode, a layer comprising Se and As, or Se and Ge and having layer thickness of 0.01 to 1 μm is formed by the vacuum evaporation technique. When the layer is formed, Se and $As_2Se_3$, or Se and Ge are simultaneously evaporated from respective boats and deposited sot hat the concentration of As or Ge will be 3 weight % on the average. Subsequently, a layer comprising Se and Te or Sb, and As or Ge and having layer thickness of 0.01 to 0.06 μm is formed by the vacuum evaporation technique. When the layer is formed, Se, Te or Sb, and $As_2Se_3$ or Ge are simultaneously evaporated from respective boats and deposited so that concentration of Te or Sb will be 10 to 15 weight % on the average and the concentration of As or Ge will be 2 weight % on the average. Further, a layer comprising Se and As, or Se and Ge is so formed by the vacuum evaporation technique that the thickness of the whole layer will be 2 to 3 μm. When the layer is formed, Se and $As_2Se_3$, or Se and Ge are simultaneously evaporated from respective different boats and deposited so that the concentration of As or Ge will be 2 weight % on the average. Further thereon, $Sb_2S_3$ is evaporated in the inert gas atmosphere of $1 \times 10^{-1}$ Torr to have thickness of 0.08 μm as the electron charge blocking layer. The target section of a photoconductive image pick-up tube having a blocking type structure is thus obtained.

EXAMPLE 15

A transparent electrode mainly comprising indium oxide is formed on a glass substrate. On the transparent electrode, a layer comprising Se, As and Ge and having layer thickness of 0.5 to 1 μm is formed. When the layer is formed, Se, $As_2Se_3$ and Ge are simultaneously evaporated from respective different boats and deposited so that the total concentration of As and Ge will be 3 weight % on the average. This is referred to as the first layer. Subsequently on the first layer, a layer comprising Se, As and at least one out of Te, Sb, Cd and Bi and having layer thickness of 0.01 to 0.06 μm is formed as the second layer by the vacuum evaporation technique. When the layer is formed, Se, $As_2$, and at least one out of Te, Sb, Cd and Bi, are simultaneously evaporated from respective different boats and deposited. The concentration of Te, Sb, Cd and Bi within the second layer is varied in the layer thickness direction. The concentration of the second layer at the start of evaporation is defined to be 0 weight % and gradually increase with the advance of evaporation. The concentration at the intermediate time of the evaporation of the second layer is made to assume the maximum value. Thereafter, the concentration gradually decreases. When the evaporation of the second layer is finished, the concentration assumes the value of 0 weight % again. At this time, the concentration of As within the second layer is made to be 2 weight % on the average. And the total concentration of one or more out of Te, Sb, Cd and Bi is made to be 15 to 45 weight % on the average of the second layer. Evaporation of the second layer is thus finished. On the second layer, a layer comprising Se and As, or Se and Ge is formed as the third layer by the vacuum evaporation technique so that the thickness of the whole layer will be 2 to 3 μm. When the layer is formed, Se and $As_2Se_3$ or Ge are simultaneously evaporated from respective different boats and deposited so that the concentration of As or Ge will be 2 weight % on the average. Further thereon, $Sb_2S_3$ is evaporated in the inert gas atmosphere of $2 \times 10^{-1}$ Torr to have thickness of 0.08 μm as the electron injection blocking layer. The target section of a photoconductive image pick-up tube having a blocking type structure is thus obtained.

The target section of an image pick-up tube derived by the above described EXAMPLES 12, 13, 14 and 15 is incorporated into the casing of the image pick-up tube containing an electron gun therein, resulting in a photoconductive image pick-up tube. When the resultant image pick-up tube is operated in the target electric field not less than $8 \times 10^7$ V/m, the signal is amplified in the amorphous semiconductor layer. When the target electric field has a value of $1.2 \times 10^8$ V/m, for example, the output with quantum efficiency not less than 10 is obtained.

In the above described EXAMPLES 12, 13, 14 and 15, it is also possible to insert a vacuum evaporation layer comprising cerium and having layer thickness of 0.03 $\mu$m, for example, as the auxiliary rectifying contact layer between the transparent electrode and the amorphous semiconductor layer. In this case, the functions of blocking injection of holes from the transparent electrode is enhanced. Accordingly, operation in higher electric field becomes possible and higher sensitivity can be realized.

EXAMPLE 16

A transparent electrode mainly comprising tin oxide is formed on a glass substrate. On this transparent electrode, Se and LiF are evaporated from respective different boats and vacuum-deposited to have thickness of 1 to 6 $\mu$m. At this time, the concentration of LiF is defined to be 500 weight ppm and distributed uniformly in the layer thickness direction. Further thereon, $Sb_2S_3$ is evaporated in the inert gas atmosphere of $2 \times 10^{-1}$ Torr to have thickness of 0.1 $\mu$m as the electron injection blocking layer. The target section of a photoconductive image pick-up tube having a blocking type structure is thus obtained.

EXAMPLE 17

A transparent electrode mainly comprising indium oxide is formed on a glass substrate. On this transparent electrode, a layer comprising Se and $CaF_2$ and having layer thickness of 0.01 to 0.045 $\mu$m is formed by the vacuum evaporation technique. When the layer is formed, Se and $CaF_2$ are simultaneously evaporated from respectaive different boats and deposited onto te substrate so that the concentration of $CaF_2$ will be 3,000 weight ppm on the average. Further thereon, Se is evaporated so that the thickness of whole layer will be 1 to 6 $\mu$m. Further thereon, $Sb_2S_3$ is evaporated in the inert gas atmosphere of $1 \times 10^{-1}$ Torr to have thickness of 0.1 $\mu$m as the electron injection blocking layer. The target section of a photoconductive image pick-up tube having a blocking type structure is thus obtained.

EXAMPLE 18

A transparent electrode mainly comprising tin oxide is formed on a glass electrode. On this transparent electrode, Se is vapor-deposited to have thickness of 0.02 to 0.06 $\mu$m. Subsequently, Se and KF are evaporated from respective different boats and vacuum-deposited to have thickness of 0.02 to 0.006 $\mu$m. At this time, the concentration of KF is defined to be 500 weight ppm and distributed uniformly in the layer thickness direction. Further thereon, a Se layer is formed by using the vacuum evaporation technique so that the thickness of the whole layer will be 1 to 3 $\mu$m. On the Se layer, $Sb_2S_3$ is evaporated in the inert gas atmosphere of $2 \times 10^{-1}$ Torr to have thickness of 0.1 $\mu$m as the electron injection blocking layer. The target section of a photoconductive image pick-up tube having a blocking type structure is thus obtained.

EXAMPLE 19

A transparent electrode mainly comprising indium oxide is formed on a glass substrate. On this transparent electrode, a layer comprising Se, As and LiF and having thickness of 0.1 to 0.045 $\mu$m is formed by the vacuum evaporation technique. When the layer is formed, Se, $As_2Se_3$ and LiF are simultaneously evaporated from respective different boats and vapor-deposited so that the concentration of As will be 3 to 6 weight % and the concentration of LiF will be 2,000 to 6,000 weight ppm on the average. Further thereon, a layer comprising Se, As and LiF and having thickness of 0.03 to 0.045 $\mu$m is formed by using the vacuum evaporation technique. At this time, the concentration of As is defined to be 2 to 3.5 weight % and the concentration of LiF is defined to be 10,000 weight ppm on the average. Further thereon, Se and as are vacuum-evaporated so that the thickness of the whole layer will be 1 to 4 $\mu$m. At this time, the concentration of As is defined to be 1 to 3 weight %. Further thereon, $Sb_2S_3$ is evaporated in the inert gas atmosphere of $1 \times 10^{-1}$ Torr to have thickness of 0.1 $\mu$m as the electron injection blocking layer. The target section of a photoconductive image pick-up tube having a blocking type structure is thus obtained.

EXAMPLE 20

A transparent electrode mainly comprising indium oxide is formed on a glass substrate. On that transparent electrode, a layer comprising Se and LiF and having layer thickness of 0.01 to 0.015 $\mu$m is formed by the vacuum evaporation technique. When the layer is formed, Se and LiF are simultaneously evaporated from respective different boats and vapor-deposited so that the concentration of LiF will be 3,000 weight ppm on the average. Further thereon, a layer comprising Se and LiF and having layer thickness of 0.03 to 0.045 $\mu$m is formed by using the vacuum evaporation technique. The concentration of LiF at this time is defined to be 8,000 to 15,000 weight ppm on the average. Further, Se and Te are evaporated from respective different boats to form a layer having a layer thickness of 0.02 to 0.05 $\mu$m. At this time, the concentration of Te is defined to be 5 to 15 weight %. Succeedingly, Se is evaporated so that the thickness of the whole layer will be 1 to 4 $\mu$m. Further thereon, $Sb_2S_3$ is evaporated in the inert gas atmosphere of $2 \times 10^{-1}$ Torr to have thickness of 0.08 $\mu$m as the electron injection blocking layer. The target section of a photoconductive image pick-up tube having a blocking type structure is thus obtained.

The target of the image pick-up tube derived by the above described EXAMPLES 16, 17, 18, 19 and 20 is incorporated into the casing of the image pick-up tube containing an electron gun therein, resulting in a photoconductive image pick-up tube. When the resultant image pick-up tube is operated in the electric field not less than $8 \times 10^7$ V/m, the signal is amplified in the amorphous photoconductive layer. When the electric field has a value of $1.2 \times 10^8$ V/m, for example, the output with the quantum efficiency not less than 10 has been obtained.

In the EXAMPLES 16, 17, 18, 19 and 20, it is also possible to insert a vacuum-evaporated layer comprising cerium oxide and having layer thickness of 0.03 $\mu$m, for example, as the auxiliary rectifying function layer between the transparent electrode and the amorphous semiconductor layer. In this case, the function of blocking injection of holes from the transparent electrode is further enhanced, resulting in operation in higher electric field and higher sensitivity.

EXAMPLE 21

A transparent electrode mainly comprising tin oxide is formed on a glass electrode. On this transparent electrode, an amorphous Se semiconductor layer is formed by using the vacuum evaporation technique.

Further thereon, Se and $SeO_2$ are evaporated from respective different boats and vacuum-deposited to have thickness of 0.02 to 0.06 μm. At this time, the concentration of $SeO_2$ is defined to be 2,500 ppm and distributed uniformly in the layer thickness direction. Further thereon, Se is evaporated to have thickness of 0.05 to 0.06 μm so that the entire layer thickness of the above described amorphous semiconductor layer mainly comprising Se will be 1 to 6 μm. Further thereon, $Sb_2S_3$ is evaporated in the inert gas atmosphere of $2\times10^{-1}$ Torr to have thickness of 0.1 μm as the electron injection blocking layer. The target section of a photoconductive image pick-up tube having a blocking type structure is thus obtained.

EXAMPLE 22

A transparent electrode mainly comprising tin oxide is formed on a glass substrate. On this transparent electrode, an amorphous Se semiconductor layer is formed by using the vacuum evaporation technique. Further thereon, $As_2Se_3$ and $GaF_3$ are evaporated from respective different boats and vacuum-deposited to have thickness of 0.03 to 0.06 μm. At this time, the concentration of $GaF_3$ is defined to be 2,000 ppm and distributed uniformly in the layer thickness direction. The thickness of the entire amorphous semiconductor layer is made to have a value of 1 to 6 μm. Further thereon, $Sb_2S_3$ is evaporated in the inert gas atmosphere of $2\times10^{-1}$ Torr to have thickness of 0.1 μm as the electron injection blocking layer. The target section of a photoconductive image pick-up tube having a blocking type structure is thus obtained.

EXAMPLE 23

A transparent electrode mainly comprising indium oxide is formed on a glass substrate. On this transparent electrode, a layer comprising Se and $CaF_2$ and having layer thickness of 0.01 to 0.05 μm is formed by using the vacuum evaporation technique. When the layer is formed, Se and $CaF_2$ are simultaneously evaporated from respective different boats and vapor-deposited so that the concentration of $CaF_2$ will be 6,000 ppm on the average. Further thereon, an amorphous Se layer is formed by the vacuum evaporation technique. Succeedingly, $As_2Se_3$ is evaporated from a boat and vacuum deposited to have thickness of 0.03 to 0.06 μm. Further thereon, Se and $GaF_3$ are evaporated from respective different boats and vacuum-deposited to have thickness of 0.02 to 0.06 μm. At this time, the concentration of $GaF_3$ is defined to be 4,000 ppm and distributed uniformly in the layer thickness direction. The thickness of the whole amorphous semiconductor layer mainly comprising Se is made to be 1 to 6 μm. Further thereon, $Sb_2S_3$ is evaporated in the inert gas atmosphere of $1\times10^{-1}$ Torr to have thickness of 0.08 μm as the electron injection blocking layer. The target section of a photoconductive image pick-up tube having a blocking type structure is thus obtained.

EXAMPLE 24

A transparent electrode mainly comprising indium oxide is formed on a glass substrate. On this transparent electrode, a layer comprising Se, As and LiF and having layer thickness of 0.01 to 0.06 μm is formed by the vacuum evaporation technique. When the layer is formed, Se, $As_2Se_3$ and LiF are simultaneously evaporated from respective different boats and deposited so that the concentration of As will be 3 to 6 weight % and the concentration of LiF will be 3,000 to 6,000 ppm on the average. Further thereon, a layer comprising Se, As and LiF and having layer thickness of 0.03 to 0.05 μm is formed by the vacuum evaporation technique. The concentration of As at this time is defined into be 2 to 3.5 weight % and the concentration of LiF is defined to be 15,000 ppm on the average. Further thereon, Se and $As_2Se_3$ are simultaneously evaporated from respective different boats to form an amorphous semiconductor layer having As concentration of 1 to 3 weight %. Further thereon, $As_2Se_3$ and $In_2O_3$ are evaporated from respective different boats and vacuum-deposited to have thickness of 0.001 to 0.1 μm. At this time, the concentration of $In_2O_3$ is defined to be 7000 ppm and distributed uniformly in the layer thickness direction. Further thereon, Se and $As_2Se_3$ are simultaneously evaporated from respective different boats and vapor-deposited to have thickness of 0.01 to 0.06 μm. The concentration of As at this time is defined to be 1 to 3 weight %. The layer thickness of the whole amorphous semiconductor layer mainly comprising Se is defined to 1 to 6 μm. Further thereon, $Sb_2S_3$ is evaporated in the inert gas atmosphere of $1\times10^{-1}$ Torr to have thickness of 0.08 μm. The target section of a photoconductive image pick-up tube having a blocking type structure is thus obtained.

EXAMPLE 25

A transparent electrode mainly comprising indium oxide is formed on a glass substrate. On the transparent electrode, a layer comprising Se and LiF and having layer thickness of 0.03 to 0.06 μm is formed by the vacuum evaporation technique. When the layer is formed, Se and LiF are simultaneously evaporated from respective different boats and deposited so that the concentration of LiF will be 4,000 ppm on the average. Further thereon, a layer comprising Se and LiF and having layer thickness of 0.03 to 0.05 μm is formed by using the vacuum evaporation technique. The concentration of LiF at this time is defined to be 8,000 to 10,000 ppm on the average. Further, Se and Te are evaporated from respective different boats to form a layer having layer thickness of 0.02 to 0.06 μm. At this time, the concentration of Te is defined to be 5 to 15 weight %. Further thereon, an amorphous Se layer is formed by using the vacuum evaporation technique. Further thereon, $As_2Se_3$ and $In_2O_3$ are evaporated from respective different boats and vacuum-deposited to have thickness of 0.003 to 0.09 μm. At this time, the concentration of $In_2O_3$ is defined to be 500 ppm and distributed uniformly in the layer thickness direction. Subsequently, Se and $In_{23}$ are evaporated from respective different boats and vacuum-deposited to have thickness of 0.02 to 0.2 μm. At this time, the concentration of $In_2O_3$ is defined to be 1,000 ppm and distributed uniformly in the layer thickness direction. The thickness of the whole amorphous semiconductor layer mainly comprising Se is defined to be 1 to 6 μm. Further thereon, $Sb_2S_3$ is evaporated in the inert gas atmosphere of $2 \times 10^{-1}$ Torr to have thickness of 0.1 μm as the electron injection blocking layer. The target section of a photoconductive image pick-up tube having a blocking type structure is thus obtained.

The target of the image pick-up tube derived by the EXAMPLES 21, 22, 23, 24 and 25 is incorporated into the casing of the image pick-up tube containing an electron gun, resulting in a photoconductive image pick-up tube. When the resultant image pick-up tube is operated in electric field not less than $8 \times 10^7$ V/m, the signal is amplified in the amorphous semiconductor layer. When the electric field has a value of $1.2 \times 10^8$ V/m, for example, the output with the quantum efficiency not less than 10 is obtained.

In the EXAMPLES 21, 22, 23, 24 and 25, it is also possible to insert a vacuum-evaporated layer comprising cerium oxide and having layer thickness of 0.03 μm, for example, as the auxiliary rectifying function layer between the transparent electrode and the amorphous semiconductor layer. In this case, the function of blocking injection of holes from the transparent electrode is further enhanced. Accordingly, operation in higher electric field becomes possible, and the charge multiplication factor can be further increased.

EXAMPLE 26

A transparent electrode mainly comprising indium oxide is formed on a glass substrate. On the transparent electrode, an amorphous semiconductor of chalcogenide family, an amorphous semiconductor of tetrahedral family, a compound semiconductor of III-V family, or a compound semiconductor of II-VI family is formed as the optical carrier generation layer having layer thickness of 0.01 to 1 μm. Further thereon, amorphous Se is vacuum-deposited to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 27

A transparent electrode mainly comprising indium oxide is formed on a glass substrate. On this transparent electrode, the same optical carrier generation layer as that of the example 26 is disposed. Further thereon, an amorphous semiconductor layer comprising amorphous Se and As, or Se and Ge and having layer thickness of 0.05 to 6 μm is vacuum-evaporated. On the amorphous semiconductor layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

The target section of the image pick-up tube derived by the EXAMPLES 26 or 27 is incorporated into the casing of the image pick-up tube containing an electron gun therein, resulting in a photoconductive image pick-up tube. When the resultant image pick-up tube is operated in electric field of $8 \times 10^7$ to $2 \times 10^8$ V/m, the signal is amplified in the amorphous semiconductor layer. When the electric field has a value of $1.2 \times 10^8$ V/m, the obtained output is 10 times that obtained when the incident light is entirely converted into a signal.

In the EXAMPLES 26 and 27, it is also possible to insert a vacuum-evaporated layer comprising cerium oxide and having layer thickness of 300 Å, for example, as the auxiliary rectifying function layer between the transparent electrode and the amorphous semiconductor layer. In this case, the function photoconductive of blocking injection of holes from the transparent electrode is enhanced. Accordingly, operation in higher electric field becomes possible, and sensitivity with charge multiplication factor not less than 10 is obtained.

EXAMPLE 28

A transparent electrode mainly comprising indium oxide is formed on a glass electrode. On this transparent electrode, a thin film comprising amorphous silicon nitride containing hydrogen and having thickness of 100 to 1,000 Å is formed as the hole injection blocking layer. Succeedingly, amorphous silicon containing hydrogen is deposited by 0.5 to 3 μm by decomposing monosilane with glow discharge while keeping the substrate at 200° to 300 C. Further thereon, Se containing arsenic at a ratio of 20% is vapor-deposited 300 Å as the intermediate layer, and succeedingly Se containing arsenic at the ratio of 2% is vacuum-deposited to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 29

A transparent electrode mainly comprising indium oxide is formed on a glass substrate. On the transparent electrode, a thin layer comprising amorphous silicon nitride containing hydrogen and having thickness of 100 to 1,000 Å is formed as the hole injection blocking layer. Succeedingly, amorphous silicon containing boron at the ratio of 5 ppm is deposited by 0.5 to 3 μm by decomposing mixed gas of monosilane and diborane with glow discharge while keeping the substrate at 200° to 300° C. As intermediate layers, amorphous Se containing tellurium at the ratio of 30% is deposited by 200 Å, and amorphous Se having composition distribution in which the concentration of arsenic successively decreases from 20% to 2% is deposited by 500 Å. Further thereon, Se comprising arsenic at the ratio of 2% is vacuum-deposited to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

The target section of an image pick-up tube derived in the EXAMPLE 28 or 29 is incorporated into the casing of the image pick-up tube containing an electron gun therein, resulting in a photoconductive image pick-up tube. When the resultant image pick-up tube is supplied with such voltage to be operated that the electric field strength applied to the charge multiplication layer becomes $8 \times 10^7$ to $2 \times 10^8$ V/m, the signal is amplified in the amorphous semiconductor layer. When the electric field strength applied to the charge multiplication layer is $1.2 \times 10^8$ V/m, for example, high sensitivity with gain close to 10 has been obtained.

EXAMPLE 30

A transparent electrode mainly comprising indium oxide is formed on a transparent substrate. On this transparent substrate, CdSe is vacuum-evaporated to have layer thickness of 0.01 to 1 μm as the optical carrier generation layer. After this glass face plate has undergone heat processing at the temperature of 200° to 400° C. in oxygen atmosphere, amorphous Se is vacuum-deposited thereon to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 31

A transparent electrode mainly comprising indium oxide is formed on a transparent substrate. Further thereon, the same optical carrier generation layer as the EXAMPLE 27 is disposed. Further thereon, an amorphous semiconductor layer comprising amorphous Se and As, or Se and Ge and having layer thickness of 0.5 to 6 μm is vacuum-deposited. On the amorphous semiconductor layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 32

A transparent electrode mainly comprising indium oxide is formed on a transparent substrate. As the optical carrier generation layer on the transparent electrode, ZnSe is vacuum-deposited to have layer thickness of 0.01 to 0.1 μm, and the ZnCdTe compound is vacuum-deposited to have thickness of 0.1 to 1 μm. After this glass face plate has undergone heat processing at the temperature of 200° C. to 600° C. in the oxygen atmosphere, amorphous Se is vacuum-deposited on the glass face plate to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 33

A transparent electrode mainly comprising indium oxide is formed on a substrate transmitting the signal light. On this transparent electrode, a layer comprising PbS and PbO is vacuum-deposited to have layer thickness of 0.01 to 1 μm. Further thereon, amorphous Se is vacuum-deposited to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

EXAMPLE 34

A transparent electrode comprising a transparent thin metal layer is formed on a substrate transmitting the signal light. On this transparent electrode, the HgCdTe compound is deposited to have layer thickness of 0.001 to 0.1 μm as the optical carrier generation layer. Further thereon, amorphous Se is vacuum-deposited to have thickness of 0.5 to 6 μm. On the amorphous Se layer, $Sb_2S_3$ is evaporated in the inert gas atmosphere of $2 \times 10^{-1}$ Torr to have thickness of 1,000 Å as the electron injection blocking layer. The target section of a photoconductive image pick-up tube is thus obtained.

The target section of an image pick-up tube derived by the EXAMPLE 30, 31, 32, 33 or 34 is incorporated into the casing of the image pick-up tube containing an electron gun therein, resulting in a photoconductive image pick-up tube. When the resultant image pick-up tube is supplied with such voltage to be operated that the electric field applied to the charge multiplication layer becomes $8 \times 10^7$ to $2 \times 10^8$ V/m, the signal is applied in the charge multiplication layer comprising amorphous semiconductor. When the electric field applied to the charge multiplication layer has a value of $1.2 \times 10^8$ V/m, for example, the obtained output is 10 times that obtained when the incident light is entirely converted into a signal current.

EXAMPLE 35

A glass substrate having a transparent electrode mainly comprising indium oxide on the surface thereof is disposed in the sputtering apparatus. On this transparent electrode, a thin $SiO_2$ layer having thickness of 100 to 1,000 Å is deposited as the hole injection blocking layer. While the substrate is kept at 200° to 300° C., mixed gas of hydrogen and argon is introduced, and high frequency power is applied to polycrystalline silicon disposed on the electrode. On the substrate, amorphous silicon containing hydrogen is deposited to have thickness of 0.5 to 3 μm. Further thereon, amorphous Se is vacuum-deposited to have thickness of 0.5 to 6 μm. On the amorphous Se layer, $Sb_2S_3$ is evaporated in the inert gas atmosphere of $2 \times 10^{-}$ Torr to have thickness of 1,000 Å as the electron injection blocking layer. The target section of a photoconductive image pick-up tube having a blocking type structure is thus obtained.

EXAMPLE 36

A transparent electrode mainly comprising indium oxide is formed on a glass substrate. On this transparent electrode, the same optical carrier generation layer comprising amorphous silicon as the EXAMPLE 35 is disposed. Further thereon, an amorphous semiconductor layer comprising amorphous Se. and As, or Se and Ge and having layer thickness of 0.5 to 6 μm is vacuum-evaporated. Further thereon, $Sb_2S_3$ is evaporated in the inert gas atmosphere of $2 \times 10^{-1}$ Torr to have thickness of 1,000 Å as the electron injection blocking layer. The target section of a photoconductive image pick-up tube having a blocking type structure is thus obtained.

The target section of an image pick-up tube derived according to The EXAMPLE 35 or 36 is incorporated into the casing of an image pick-up tube containing an electron gun therein, resulting in a photoconductive image pick-up tube. When the resultant image pick-up tube is supplied with such voltage to be operated that the electric field strength applied to the charge multiplication layer becomes $8 \times 10^7$ to $2 \times 10^8$ V/m, the signal is amplified in the amorphous semiconductor layer. When the electric field strength applied to the charge multiplication layer is $1.2 \times 10^8$ V/m, high sensitivity with gain close to 10 is obtained.

EXAMPLE 37

A transparent electrode mainly comprising tin oxide is formed on a glass substrate. As the auxiliary rectifying contact layer, $GeO_2$ and $CeO_2$ are vapor-deposited in the vacuum of $3\times10^{-6}$ Torr to have thickness of 200 Å and 200 Å, respectively. As an amorphous semiconductor layer thereon, Se and $As_2Se_3$ are vapor-deposited from respective evaporation boats to have thickness of 1 ∥ m. In this case, the concentration of As is defined to 2% in weight proportion and distributed uniformly in the layer thickness direction. The amorphous semiconductor layer is vapor-deposited in the vacuum of $2\times10^{-6}$ Torr. On this amorphous semiconductor layer, $Sb_2S_3$ is evaporated in the argon atmosphere of $3\times10^{-1}$ Torr to have thickness of 800 Å as the electron injection blocking layer. The target section thus formed is incorporated into an image pick-up tube. The amorphous semiconductor layer of the image pick-up tube is operated in the electric field of $8\times10^7$ V/m to $2\times10^8$ V/m causing the charge multiplication.

EXAMPLE 38

A transparent electrode mainly comprising indium oxide is formed on a glass substrate. On this transparent electrode, $CeO_2$ is evaporated in vacuum of $3\times10^{-6}$ Torr to have thickness of 300 Å as the auxiliary rectifying contact layer. Further thereon, Se is evaporated in the vacuum of $2\times10^{-6}$ Torr to have thickness 2 μm as the amorphous semiconductor layer. On this amorphous semiconductor layer, $Sb_2S_3$ is evaporated in the argon atmosphere of $2\times10^{-1}$ Torr to have thickness of 1,000 Å as the electron injection blocking layer. The target section thus formed is incorporated into an image pick-up tube. The amorphous semiconductor layer of the resultant image pick-up tube is operated in the electric field of $8\times10^7$ to $2\times10^8$ V/m causing the charge multiplication.

EXAMPLE 39

A transparent electrode mainly comprising indium oxide is formed on a glass substrate. Further as the auxiliary rectifying contact layer, $GeO_2$ and $CeO_2$ are vapor-deposited to have thickness of 200 Å and 200 Å, respectively. This vapor deposition is carried out in the vacuum of $2\times10^{-6}$ Torr. Subsequently, an amorphous semiconductor layer is vapor-deposited. In order to form the amorphous semiconductor layer, Se and $As_2Se_3$ are at first evaporated from respective evaporation boats and deposited to have thickness of 300 Å. In this case, the As concentration is defined to be 3% in weight proportion and distribution uniformly in the layer thickness direction. Subsequently, Se, $As_2Se_3$ and LiF are evaporated from respective different evaporation boats and vapor-deposited to have thickness of 600 Å. The As concentration at this time is 2% in weight proportion, and the LiF concentration is 2,000 ppm in weight proportion and distributed uniformly in the layer thickness direction. Further thereon, Se and $As_2Se_3$ are evaporated from respective evaporation boats and vapor-deposited to have thickness of 1.4 μm. In this case, the As concentration is defined to be 2% in weight proportion and distributed uniformly in the layer thickness direction. The evaporation of the amorphous semiconductor layer is thus finished. The evaporation of amorphous semiconductor layer is carried out in the vacuum of $2\times10^{-6}$ Torr. An electron injection blocking layer is vapor-deposited on the amorphous semiconductor layer. In the argon atmosphere of $3\times10^{-1}$ Torr, $Sb_2S_3$ is evaporated to have thickness of 900 * as the electron injection blocking layer. The target thus formed is incorporated in an image pick-up tube. The amorphous semiconductor layer of the image pick-up tube is operated in the electric field of $7\times10^7$ to $2\times10^8$ V/m causing the charge multiplication.

EXAMPLE 40

A transparent electrode mainly comprising indium oxide is formed on a glass substrate. Further, $CeO_2$ is evaporated in the vacuum of $3\times10^{-6}$ Torr to have thickness of 300 * as the auxiliary rectifying contact layer. On that auxiliary rectifying contact layer, Se and $As_2Se_3$ are at first evaporated from respective different evaporation boats to have thickness of 1.4 μm as the amorphous semiconductor layer. The As concentration at this time is defined to be 3% in weight proportion, and the concentration of $In_2O_3$ is defined to be 500 ppm in weight proportion. These concentrations are uniformly distributed in the layer thickness direction. Evaporation of the amorphous semiconductor layer is thus finished. Evaporation of the amorphous semiconductor layer is carried out in the vacuum of $2\times10^{-6}$ Torr. On the amorphous semiconductor layer, $Sb_2S_3$ is evaporated in the argon atmosphere of $3\times10^{-1}$ Torr to have thickness of 900 * as the electron injection blocking layer. The target section thus formed is incorporated into an image pick-up tube. The amorphous semiconductor layer of the image pick-up tube is operated in the electric field of $7\times10^7$ to $2\times10^8$ V/m causing the charge multiplication.

EXAMPLE 41

A transparent electrode mainly comprising tin oxide is formed on a glass substrate. Further, $GeO_2$ and $CeO_2$ are evaporated in the vacuum of $3\times10^{-6}$ Torr to respectively have thickness of 200 * and 200 * as the auxiliary rectifying contact layer. Further thereon, an amorphous semiconductor layer is vapor-deposited. The amorphous semiconductor layer is formed as described below. At first, Se and $As_2Se_3$ are vapor-deposited to have thickness of 300 * by respective different evaporation boats. The As concentration at this time is defined to be 6% in weight proportion and distributed uniformly in the layer thickness direction. Subsequently, Se, $As_2Se_3$ and LiF are vapor-deposited to have thickness of 600 * by respective different evaporation boats. In this case, the As concentration is defined to be 2% in weight proportion, and the LiF concentration is defined to be 4,000 and distributed uniformly in the layer thickness direction. Subsequently, Se and $As_2Se_3$ are vapor-deposited to have thickness of 1.4 μm by respective different evaporation boats. In this case, the concentration of As is defined to be 2% in weight proportion and distributed uniformly in the layer thickness direction. Further thereon, Se, $As_2Se_3$ and $In_2O_3$ are vapor-deposited to have thickness of 2,000 * by respective different evaporation boats. The As concentration at this time is defined to be 3% in weight proportion, and the concentration of $In_2O_3$ is defined to be 700 ppm in weight proportion and distributed uniformly in the layer thickness direction. Further thereon, Se and $As_2Se_2$ are vapor-deposited to have thickness of 2,000 * by respective different evaporation boats. In this case, the concentration of As is defined to be 2% in weight proportion and distributed uniformly in the layer thickness direction. Evaporation of the amorphous semiconductor layer is thus finished. Evaporation of the amorphous semiconductor layer is carried out in the vacuum of $3\times10^{-6}$ Torr. On this amorphous semiconductor layer, $Sb_2S_3$ is evaporated in the argon atmosphere of $2\times10^{-1}$ Torr to have thickness of 1,000 * as the electron injection blocking layer. The target section thus formed is incorporated into an image pick-up tube. The amorphous semiconductor layer of the image pick-up tube is operated in the electric field of $7\times 10^7$ to $2\times 10^8$ V/m causing charge multiplication.

EXAMPLE 42

A transparent electrode mainly comprising indium oxide is formed on a glass substrate. Further, $CeO_2$ is evaporated in the vacuum of $3\times 10^{31\ 6}$ Torr to have thickness of 200 Å as the auxiliary rectifying contact layer. Further thereon, an amorphous semiconductor layer is vapor-deposited. The amorphous semiconductor layer is formed as described below. At first, Se and $As_2Se_3$ are vapor-deposited to have thickness of 5,000 Å by respective different evaporation boats. The concentration of As at this time is defined to be 3% in weight proportion and distributed uniformly in the layer thickness direction. Subsequently, Se and $As_2Se_3$ are vapor-deposited to have thickness of 300 Å by respective different evaporation boats. In this case, the concentration of As is defined to be 20% in weight proportion and distributed uniformly in the layer thickness direction. Subsequently, Se and $As_2Se_3$ are vapor-deposited to have thickness of 5,000 Å by respective different evaporation boats. The concentration of As in this case is defined to be 3% in weight proportion and distributed uniformly in the layer thickness direction. Further thereon, Se and $As_2Se_3$ are vapor-deposited to have thickness of 300 Å by respective different evaporation boats. The concentration of As at this time is defined to be 20% in weight proportion and distributed uniformly in the layer thickness direction. Further thereon, Se and $As_2Se_3$ are vapor-deposited to have thickness of 5,000 Å by respective different boats. The concentration of As in this case is defined to be 10% in weight proportion and distributed uniformly in the layer thickness direction. Evaporation of the amorphous semiconductor layer is thus finished. Evaporation of the amorphous semiconductor layer is carried out in the vacuum of $3\times 10^{-6}$ Torr. An electron injection blocking layer is evaporated on the amorphous semiconductor layer. The electron injection blocking layer is formed by evaporating $Sb_2S_3$ in the argon atmosphere of $3\times 10^{-1}$ Torr to have thickness of 900 Å. The target thus formed is incorporated into an image pick-up tube. The amorphous semiconductor layer of the image pick-up tube is operated in the electric field of $5\times 10^7$ to $2\times 10^8$ V/m causing charge multiplication.

EXAMPLE 43 a transparent electrode mainly comprising tin oxide is formed on a glass substrate. Further, $GeO_2$ and $CeO_2$ are evaporated in the vacuum of $2\times 10^{-6}$ Torr to respectively have 150 Å as an auxiliary rectifying contact layer. Further thereon, an amorphous semiconductor layer is vapor-deposited. The amorphous semiconductor layer is formed as described below. At first, Se and $As_2Se_3$ are vapor-deposited from respective different evaporation boats to have thickness of 600 Å. The concentration of As at this time is defined to be 3% in weight proportion and distributed uniformly in the layer thickness direction. Subsequently, Se and $As_2Se_2$ are vapor-deposited from respective different evaporation boats to have thickness of 150 Å. The concentration of As in this case is defined to be 10% in weight portion and distributed uniformly in the layer thickness direction. Subsequently, Se, Te, $As_2Se_3$ and LiF are vapor-deposited to have thickness of 900 Å by respective different evaporation boats. In this case, the concentrations of Te, As and LiF are 15%, 2% and 4,000 ppm in weight proportion and distributed uniformly in the layer thickness direction. Further thereon, Se, $As_2Se_3$ and $In_2O_3$ are vapor-deposited to have thickness of 150 Å by respective different evaporation boats. The concentration of As at this time is defined to be 25% in weight proportion, and the concentration of $In_{23}$ is defined to be 500 ppm in weight proportion. These concentrations are distributed uniformly in the layer thickness direction. Further thereon, Se and $As_2Se_3$ are vapor-deposited to have thickness of 1.8 $\mu$m by respective different boats. The concentration of As in this case is defined to be 2% in weight proportion and distributed uniformly in the layer thickness direction. Evaporation of the amorphous semiconductor layer is thus finished. Evaporation of the amorphous semiconductor layer is carried out in the vacuum of $2\times 10^{-6}$ Torr. Succeedingly, an electron injection blocking layer is vapor-deposited on the amorphous semiconductor layer. The electron injection blocking layer is formed by vapor-depositing $Sb_2S_3$ to have thickness of 1,000 Å in the argon atmosphere of $3\times 10^{-1}$ Torr. The target thus formed is incorporated into an image pick-up tube. The amorphous semiconductor layer of the image pick-up tube is operated in the electric field of $5\times 10^7$ to $2\times 10^8$ V/m causing charge multiplication.

EXAMPLE 44

A transparent electrode mainly comprising indium oxide is formed on a glass substrate. Further, $CeO_2$ is evaporated in the vacuum of $3\times 10^{-6}$ Torr to have thickness of 200 Å as the auxiliary rectifying contact layer. On that contact layer, an amorphous semiconductor layer is vapor-deposited. The amorphous semiconductor layer is formed as described below. At first, Se and $As_2Se_3$ are vapor-deposited to have thickness of 2,000 Å by respective different evaporation boats. The concentration of As at this time is defined to be 3% and distributed uniformly in the layer thickness direction. Subsequently, Se, $As_2Se_3$ and LiF are vapor-deposited to have thickness of 500 Å by respective different evaporation boats. In this case, the concentration of As is 1% in weight proportion and the concentration of LiF is 2,000 ppm in weight proportion. These concentrations are distributed uniformly in the layer thickness direction. Subsequently, Se, $As_2Se_3$ and Te are vapor-deposited to have thickness of 1 $\mu$m by respective different evaporation boats. In this case, the concentration of As is 1% in weight proportion and distributed uniformly in the layer thickness direction. The concentration of Te is increased at a constant slope in the range of layer thickness of 1 $\mu$m. At the start of Te evaporation, the concentration of Te is 1% in weight proportion. At the end of Te evaporation, the concentration of Te is 1.5% in weight proportion. Subsequently, Se and $As_2Se_3$ are vapor-deposited to have thickness of 150 Å by respective different evaporation boats. In this case, the concentration of As is defined to be 20% in weight proportion and distributed uniformly in the layer thickness direction. Further thereon, Se and $As_2Se_3$ are vapor-deposited to have thickness of 2,500 Å by respective different evaporation boats. The concentration of As at this time is defined to be 2% in weight proportion and distributed uniformly in the layer thickness direction. Evaporation of the amorphous semiconductor layer is thus finished. Evaporation of the amorphous semiconductor layer is carried out in the vacuum of $2\times10^{-6}$ Torr. On the amorphous semiconductor layer, $Sb_2S_3$ is evaporated in the argon atmosphere of $2\times10^{-1}$ Torr to have thickness of 900 Å as the electron injection blocking layer. The target section thus formed is incorporated into an image pick-up tube. The amorphous semiconductor layer of the image pick-up tube is operated in the electric field of $6\times10^7$ to $2\times10^8$ V/m causing charge multiplication.

EXAMPLE 45

A transparent electrode mainly comprising tin oxide is formed on a glass substrate. Further, a hydride amorphous silicon nitride layer is formed to have layer thickness of 200 Å as the auxiliary rectifying contact layer by using the glow discharge technique. A hydride amorphous silicon layer is formed to have layer thickness of 2,000 Å by using the glow discharge technique. Further thereon, Se and $As_2Se_3$ are vapor-deposited to have thickness of 130 Å by respective different evaporation boats. The concentration of As in this case is defined to be 30% in weight proportion and distributed uniformly in the layer thickness direction. Further thereon, Se and $As_2Se_3$ are vapor-deposited to have thickness of 1.8 μm by respective different evaporation boats. The concentration of As at this time is defined to be 2% in weight proportion and distributed uniformly in the layer thickness direction. Evaporation of Se and $As_2Se_3$ of the amorphous semiconductor layer is carried out in the vacuum of $3\times10^{-6}$ Torr. Subsequently, an electron injection blocking layer is vapor-deposited. The electron injection blocking layer is formed by evaporating $Sb_2S_3$ in the argon atmosphere of $3\times10^{-1}$ Torr to have thickness of 1,000 Å. The target section thus formed is incorporated into an image pick-up tube. The amorphous semiconductor layer of the image pick-up tube is operated in the electric field of $6\times10^7$ to $2\times10^8$ V/m causing charge multiplication.

EXAMPLE 46

A transparent electrode mainly comprising tin oxide is formed on a glass substrate. Subsequently, an amorphous semiconductor layer is vapor-deposited. The amorphous semiconductor layer is formed as described below. At first, Se is vapor-deposited to have thickness of 1,000 Å. Subsequently, Se and LiF are vapor-deposited to have thickness of 1,000 Å by respective different evaporation boats. The concentration of LiF at this time is defined to be 3,000 ppm in weight proportion and distributed uniformly in the layer thickness direction. Further thereon, Se is vapor-deposited to have thickness of 1.8 μm. Evaporation of the amorphous semiconductor layer is thus finished. Evaporation of the amorphous semiconductor layer is carried out in the vacuum of $2\times10^{-6}$ Torr. An electron injection blocking layer is vapor-deposited on the amorphous semiconductor layer. The electron injection blocking layer is formed by vapor-depositing $Sb_2S_3$ in the argon atmosphere of $3\times10^{-1}$ Torr to have thickness of 1,000 Å. The target section thus formed is incorporated into an image pick-up tube. The amorphous semiconductor layer of the image pick-up tube is operated in the electric field of $7\times10^7$ to $2\times10^8$ V/m causing charge multiplication.

EXAMPLE 47

A transparent electrode mainly comprising tin oxide is formed on a glass substrate. On this transparent electrode, an amorphous semiconductor comprising Se-As-Te and having thickness of 0.5 to 6 μm is vapor-deposited. On the amorphous Se-family layer, $Sb_2S_3$ is evaporated in the inert gas atmosphere of $2\times10^{-1}$ Torr to have thickness of 0.1 μm as the electron injection blocking layer. The target section of a photoconductive image pick-up tube having a blocking type structure is thus obtained. The target section of an image pick-up tube thus obtained is incorporated into the casing of an image pick-up tube containing an electron gun therein, resulting in a photoconductive image pick-up tube. The resultant image pick-up tube is incorporated into a TV camera capable of controlling the temperature of the target section. The TV camera contains heat generators including a deflection coil of an image pick-up tube, a heater for generating the electron beam, and a signal processing circuit. As the above described temperature control mechanism, therefore, The TV camera may have cooling function. Cooling is attained by blowing outside air against the target by means of a small-sized blowing fan when a temperature such as a thermocouple or a thermistor finds that the temperature of the target section has risen up to the temperature set point. The cooling method is not necessary limited to the above described method. For example, the target can be cooled by operating a thermoelectric cooling device attached to the vicinity of the target section or by inserting an insulative medium having heat conduction function between the target section and the cooling section. The target section is kept at 35° C., for example, by using such a method, and operated in the target electric field not less than $8\times10^7$ V/m. As a result, the signal is amplified in the amorphous semiconductor layer. When the electric field has a value of $1.2\times10^8$ V/m, for example, the output with the gain not less than 10 can be obtained while restraining the HAI to a low value.

Further, a vacuum-evaporated layer comprising cerium oxide and having layer thickness of 0.03 μm, for example, may be inserted as the auxiliary rectifying contact layer between the transparent electrode and the amorphous semiconductor layer. In this case, the function of blocking injection of holes from the transparent conductive layer is enhanced. As a result, operation in higher electric field becomes possible and further high sensitivity is obtained.

EXAMPLE 48

Example 48 will be explained referring to FIG. 16A.

A transparent electrode 16' composed mainly of iridium oxide is formed on a transparent substrate 11'. An a-Si:H having a layer thickness of 0.5-10 μm is formed thereon by a photoconductive layer 14' including amorphous semiconductor by the plasma CVD method by using $SiH_4$ as source gas. Further, an a-SiC:H having a layer thickness of 10 n, doped with P at 50 ppm, is formed thereon as a hole blocking layer 13' by using $SiH_4$ and $C_2H_6$ as source gases and $PH_3$ as doping gas. A photoelectric conversion device is obtained by depositing an Al as electrode 16' as a counter electrode further thereon.

EXAMPLE 49

Figure 19A:
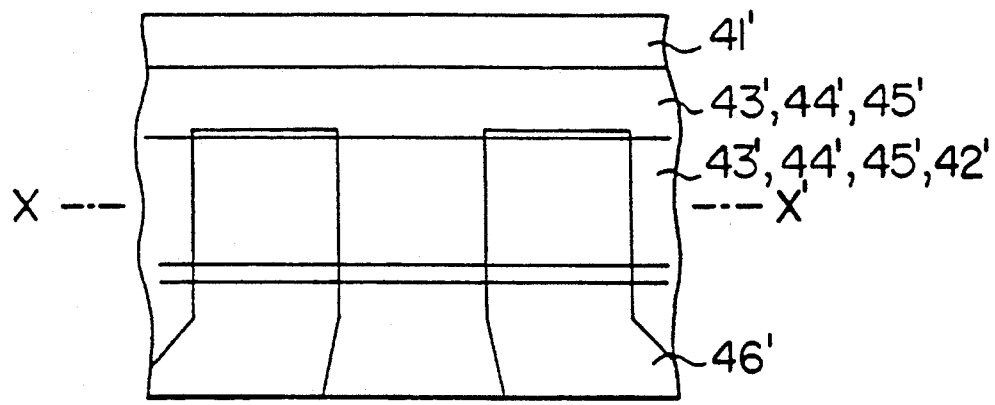
FIGS. 19A and 19B are schemes for explaining the structure of a one-dimensional image sensor, which is an embodiment of the photoconductive device according to this second aspect of the present invention.
Figure 19B:
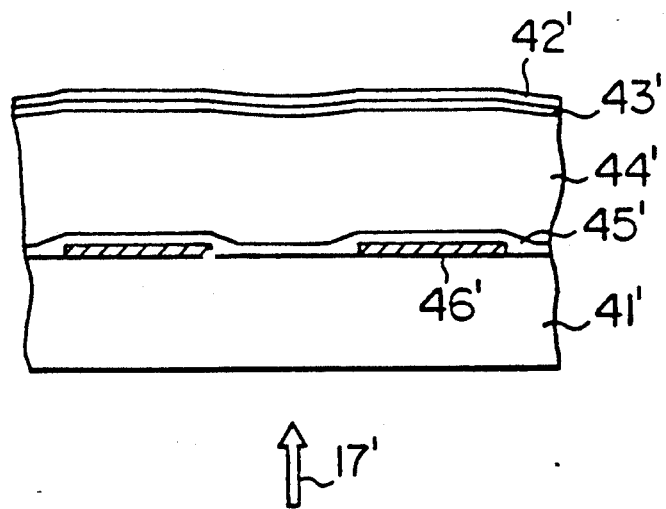

FIGS. 19A and 19B indicate the construction of a one-dimensional image sensor, which is an embodiment of the second aspect of the present invention. FIG. 19A is a plan view showing a part thereof and FIG. 19B is a cross-sectional view along the XX' line in FIG. 19A A transparent conductive film composed mainly of iridium oxide is deposited on a transparent substrate 41'. Then the conductive film is separated into a plurality of portions by the photoetching so as to form individual reading-out electrodes 46'. An a-SiC:H having a layer thickness of 10 nm, doped with B at 50 ppm, is formed thereon as an electron blocking layer 45' by means of a mask by using $SiH_4$ and $C_2H_6$ as source gases and $B_2H_6$ as doping gas. An a-Si:H having a layer thickness of 0.5-10 μm is formed further thereon as a photoconductive layer 44' containing amorphous semiconductor by means of the same mask by sputtering an Si target, using a mixed gas of Ar and $H_2$. An a-SiC:H having a layer thickness of 10 nm, doped with P at 50 ppm is formed further thereon as a hole blocking layer 43' by means of the same mask by using $SiH_4$ and $C_2H_6$ as source gases and $PH_3$ as doping gas. Al is deposited further thereon as a common electrode 42' by means of a mask different from that described above. Thereafter, the reading-out electrodes 46' are connected to a scanning circuit disposed on the substrate by a method such as bonding, etc. so as to obtain a one-dimensional image-sensor.

In the case where an electric field higher than $5 \times 10^7$ V/m is applied to the photoconductive device of the EXAMPLE 48 or 49, so that the transparent substrate 11', 41' side is negative with respect to the counter electrode 12', 42' and incident light 17' is projected to the transparent substrate 11', 41', a high sensitivity with a grain greater than 1 can be realized without impairing the photoresponse. Further, even in the case where it is driven continuously for a long time at 80° C., no degradations in the characteristics are caused.

EXAMPLE 50

Figure 20:
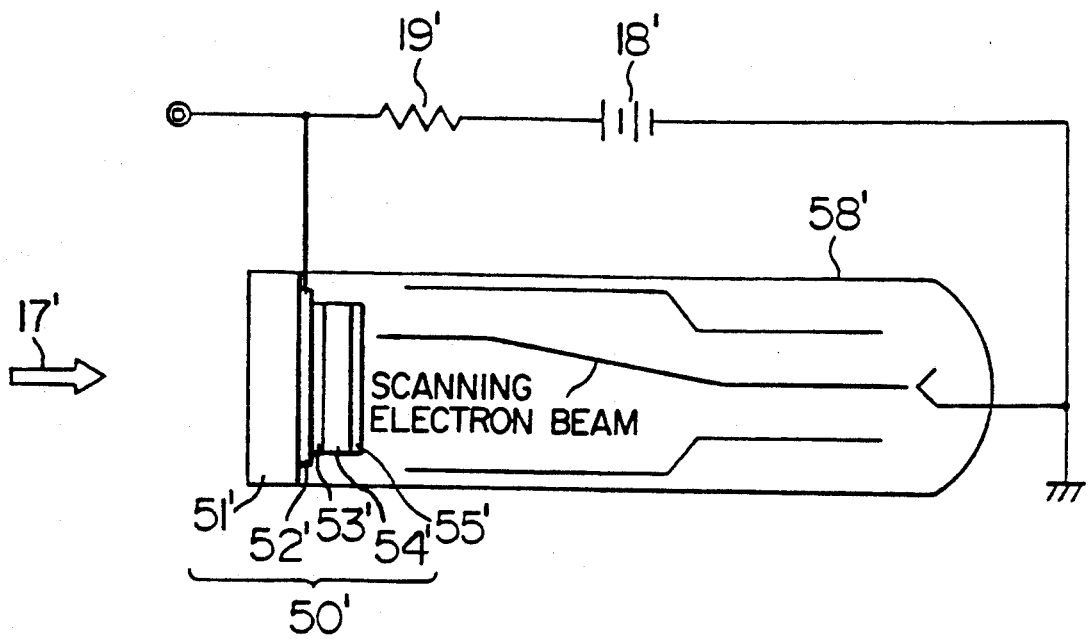
FIG. 20 is a scheme for explaining the structure of a image pick-up tube, which is another embodiment of the photoelectric conversion device according to this second aspect of the present invention.

FIG. 20 shows a construction of an image pick-up tube, which is another embodiment of this invention. A transparent electrode 52' composed mainly of $In_2O_3$ is formed on a glass substrate 51'. An a-Si:H having a layer thickness of 10 nm, doped with P at 50 ppm, is formed thereon as a hole blocking layer 53' by using $PH_4$ as doping gas. Then an a-Si:H having a layer thickness of 0.5-10 μm is deposited by the plasma CVD method by using $SiH_4$ as source gas so as to obtain a photoconductive layer 54'. Then $Sb_2S_3$ is deposited to a layer thickness of 100 nm as an electron blocking layer 55' in an Ar atmosphere of 13.3 Pa ($10^{-1}$ Torr). A target portion 50 ' of an image pick-up tube can be obtained by those described above from 51' to 55'. An image pick-up tube is obtained by mounting this target portion 50' in a glass tube 58' and evacuating the glass tube 58'.

EXAMPLE 51

An example, in which this invention is applied to an image pick-up tube, similarly to EXAMPLE 50, is shown. In this example also Ge is used as the element belong to tetrahedral system. In FIG. 20, a transparent electrode 52' composed mainly of $In_{23}$ is formed on a glass substrate 51'. An a-Si:H having a layer thickness of 10 nm, doped with P at 50 ppm, is formed thereon as a hole blocking layer 53' by using $PH_4$ as doping gas. Then an a-Ge:H having a layer thickness of 05-10 ||m is formed by the plasma CV method by using $GeH_4$ as source gas so as to obtain a photoconductive layer 54'. Thereafter amorphous material composed of Se-As-Te is deposited to a layer thickness of 100 nm as an electron block layer 55' in an $N_2$ atmosphere of 13.3 Pa ($10^{-1}$ Torr). An image pick-up tube is obtained by using an image pick-up tube target portion 50' thus obtained in the same way as in EXAMPLE 50.

When an electric field higher than $8 \times 10^7$ V/m is applied to the photoconductive layer in the image pick-up tube in EXAMPLE 50 OR 51 so that the transparent electrode 52' is positive, it is possible to realize a high sensitivity with a photoconductive gain greater than 1 without impairing the photoresponse. Further, it is confirmed that its characteristics are thermally stable. In the figure reference numeral 19' indicates a load resistance.

Now, several examples will be explained, in the case where the photoconductive layer composed of amorphous silicon carbide is formed as the amorphous semiconductor layer for charge multiplication. In the following examples amorphous silicon carbide (a-$Si_{1-x}C_x$:H) is formed by the plasma CVD method using $SiH_4$, $SiF_4$, etc. and $CH_4$, $C_2H_6$, $C_2H_4$, etc. as source gases or by the reactive sputtering method of Si in a gaseous medium of H, Ar, $CH_4$, etc. At this time, the concentration of carbon in the layer is controlled by regulating the flow rate of the source gas and the partial pressure of the gas of the atmosphere. Further, in the method described above, an n conductivity type a-SiC:H is obtained by adding a gaseous compound of an element of V family such as P, As, Sb, etc. and an p conductivity type a-SiC:H is obtained by adding a gaseous compound for an element of III family such as B, Al, etc.

EXAMPLE 52

Explanation will be made, referring to FIG. 16A

A transparent electrode 16' composed mainly of iridium oxide si formed on a transparent substrate 11'. An a-$Si_{70}C_{30}$:H having a layer thickness of 0.5-10 μm is formed thereon as a photoconductive layer 14' including amorphous semiconductor. An a-$Si_{50}C_{50}$:H doped with P at 50 ppm is formed further thereon to a thickness of 10 nm so as to form a hole blocking layer 13'. A photoelectric conversion device is obtained by depositing an Al electrode further thereon as a counter electrode 12'.

EXAMPLE 53

Figure 21:
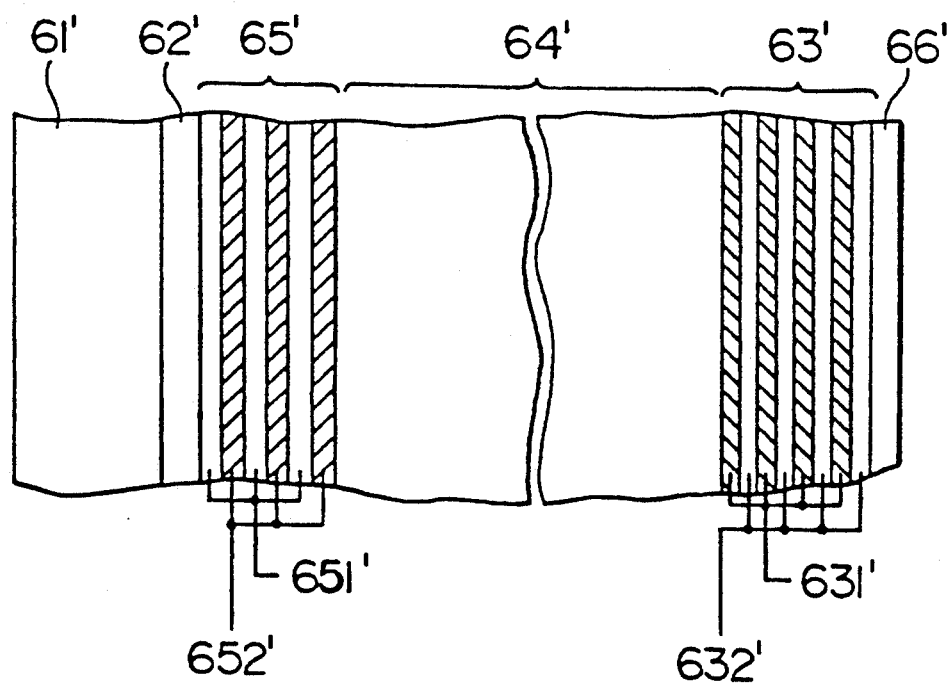
FIG. 21 is a scheme for explaining the structure of a photosensitive element, which is still another embodiment of the photoelectric conversion device according to this second aspect of the present invention.

FIG. 21 shows the schematical construction of a light sensitive element, which is an embodiment of this second aspect of the present invention. This light sensitive element is formed by depositing successively a transparent electrode 62' composed mainly of indium oxide, an electron blocking layer 65', a photoconductive layer 64', a hole blocking layer 63' and an Au electrode 66' on a transparent substrate 61'. The electron blocking layer 65' consists of 3 layers 651' made of a-$Si_{60}C_{40}$:H and 3 layers 652' made of a-$Si_{70}C_{30}$:H doped with B at 10 ppm overlaid alternately on each other, each of the layers being 5 nm thick. The photoconductive layer 64' is a layer 2-8 μm thick and made of a-$Si_{80}C_{20}$:H doped with P at 50 ppm. The hole blocking layer 63' consists of 4 layers 631' made of a-$Si_{70}C_{30}$:H doped with As at 50 ppm and 4 layers 632' made of a-$Si_{50}C_{50}$:H overlaid alternately on each other, each of the layers being 2.5 nm thick. As described above, it is possible to obtain a carrier blocking layer made of a-SiC:H, with effective wide band gap and effective p or n conductivity type, having good characteristics, and having an excellent carrier blocking ability, if it consists of undoped a-SiC:H layers having a wide band gap and doped a-SiC:H layers having a narrow band gap.

EXAMPLE 54

Figure 23A:
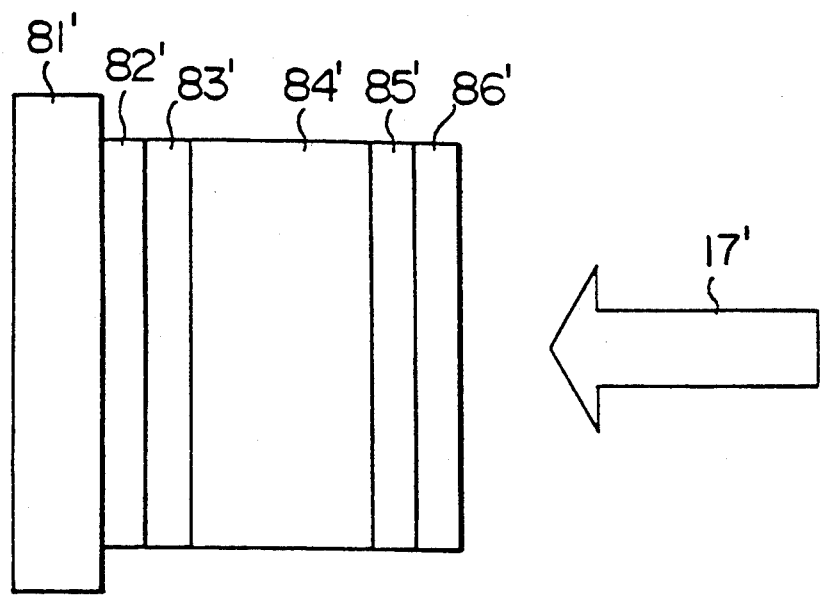
FIGS. 23A and 23B are schemes for explaining the structure of still another photosensitive element, which is still another embodiment of the photoconductive device according to this second aspect of the present invention.

Explanation will be made, referring to FIG. 23A.

An electrode 82' composed mainly of Cr, is formed on a semi-insulating semiconductor substrate 8'. a-SiN:H is deposited thereon to a layer thickness of 10 nm as a hole blocking layer 83'. Then a s-Si$_{80}$C$_{20}$:H is deposited thereon to a layer thickness of 0.5'10 μm as a photoconductive layer 84'. Thereafter a thin layer made of silicon oxide is deposited thereon to a layer thickness of 8 nm as an electron blocking layer 85'. A photoconductive device can be obtained by forming a transparent electrode 86' composed mainly of tin oxide further thereon.

EXAMPLE 55

Figure 22A:
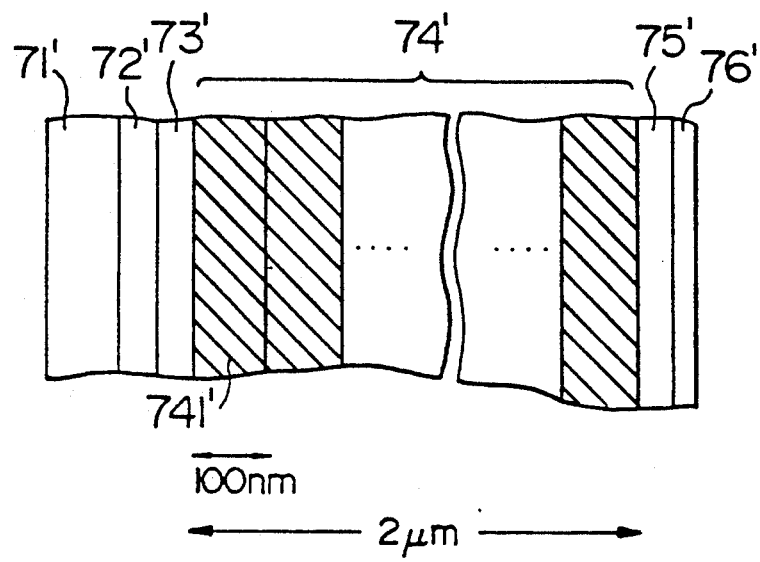
FIG. 22A and 22B are schemes for explaining the structure of another photosensitive element, which is still another embodiment of the photoelectric conversion device according to this second aspect of the present invention.
Figure 22B:
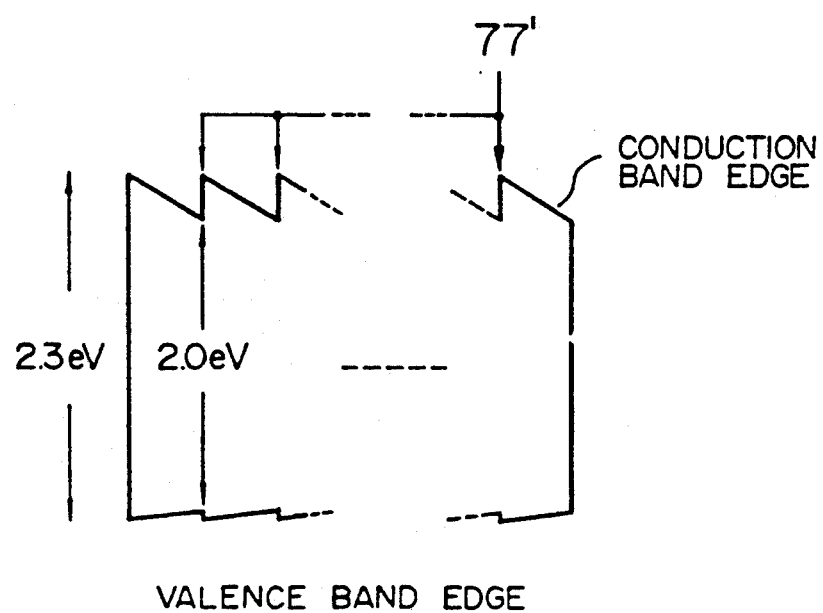

FIG. 22A indicates a schematical construction of a light sensitive element, which is still another embodiment of this invention. The overall construction is identical to that indicated in FIG. 16B. This element consists of an electrode 72' composed mainly of Ta, a hole blocking layer 73', an amorphous semiconductor layer 74', an electron blocking layer 75', and a transparent electrode 76' successively formed on an arbitrary substrate 71'. The hole blocking layer 73' is made of CeO$_2$ having a layer thickness of 10 nm and the electron blocking layer 75' is made of a-Si$_{70}$C$_{30}$:H doped with B at 100 ppm and having a layer thickness semiconductor of 10 n.. The amorphous semiconductor layer 74' is a layer 2 μm thick made of a-SiC:H. At this time a first portion 741' which is 100 nm thick is so formed that the C concentration in the layer decreases from 35% to 10%. This operation being considered to be one period, the amorphous semiconductor layer 74' is completed by repeating similar operations (by about 20 periods). As a result, as indicated in FIG. 22B, the band gap varies from 2.3 eV to 2.0 eV with a period of 100 nm. In this case, at the discontinuous portions 77 of the band gap its value varies significantly. However, if the band gap is varied by varying the composition of the compound consisting of Si and carbon as in this example, almost all the difference of the band gap at the discontinuous portions 77' is attributable to displacement of the conduction band edge. Consequently, in the case where this element is used under the condition in which the transparent electrode is negatively raised, traveling electrons gain energy corresponding to the energy difference of the conduction band edge, when they pass through the discontinuous portions 77' of the forbidden band width and thus it is possible to increase the effective electron multiplication factor with respect to that obtained in the case where the band gap is continuous.

EXAMPLE 56

Figure 23B:
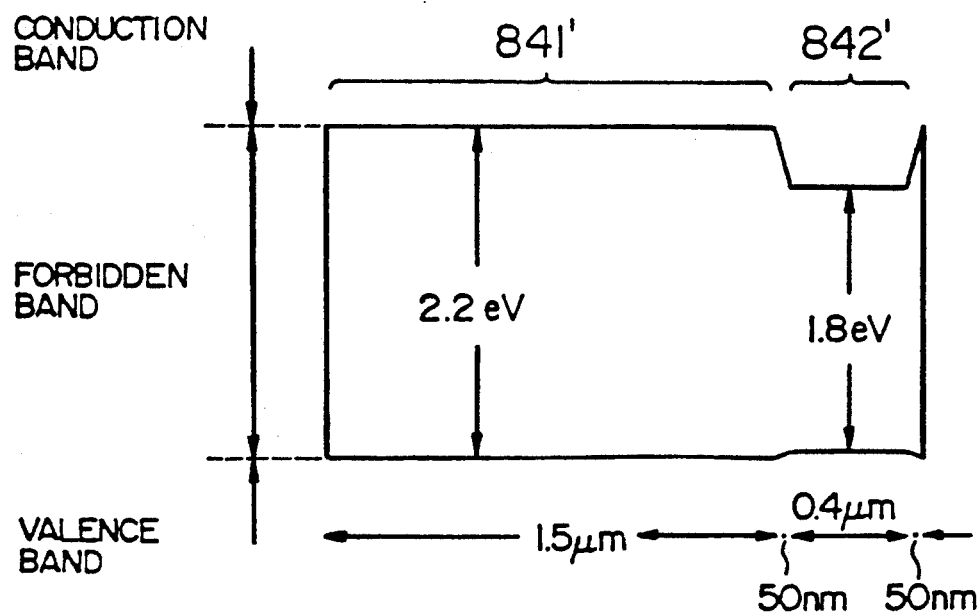

Explanation will be made by referring to FIGS. 23A and 23B.

An electrode 82' composed mainly of n+ conductivity type crystalline Si is formed on a semi-insulating semiconductor substrate 81'. A hole blocking layer 83' made of a-Si$_{70}$C$_{30}$:H doped with P at 100 ppm is deposited thereon to a layer thickness of 5 nm. Then an amorphous semiconductor layer 84' 0.6–10 μm thick, and composed mainly of a-SiC:H and comprised of 841' and 842' is formed further thereon. At this time portion 842', where the band gap is small, is disposed within the amorphous semiconductor layer by controlling the C concentration in the layer. For example, the C concentration in the layer is so called that it is 30 at. % in the first portion 841', 1.5 μm thick; it is decreased from 30 at. % to 0% in the succeeding portion 50 nm thick; it is constant at 0% in the succeeding portion 0.5 μm thick; and finally it is increased continuously from 0% to 30 at. % in the succeeding portion 50 nm thick. As a result, the band gap is so shaped that it is 2.2 eV at the portion 841' where the C concentration is 30 at. % and 1.8 eV at the portion 842' where the C concentration is 0%, as shown in FIG. 19B. Therefore, the band gap has a shape, as principally conduction band edge is narrowed. After that, an electron blocking layer 85' 10 nm thick and make of a-Si$_{70}$C$_{30}$:H doped with B at 100 ppm is formed further thereon. A transparent electrode 86' composed mainly of tin oxide is formed further thereon so as to obtain a photoconductive device. The efficiency of the photoelectric conversion is increased especially for light having long wavelengths by adopting this structure so that the portion 842' having a narrow band gap absorbs incident light 17' with a high efficiency. In addition, in this way, since the charge generation layer and the charge multiplication layer are substantially separated, it is possible to suppress noise generation accompanied by the charge multiplication.

When an electric field higher than $5 \times 10^7$ V/m is applied to a photoelectric conversion device described in one of the EXAMPLES 52 to 56, it is possible to realize a high sensitivity with a photoconductive gain greater than 1 without impairing the photoresponse. Further no variations in characteristics are caused, even if they are operated continuously for a long time at a temperature of 80° C.

While we have shown and described several embodiments in accordance with the present invention, it is understood that the same is not limited thereto, but is susceptible to numerous changes and modifications as know to one having ordinary skill in the art and we therefore do not wish to be limited to the details shown and described herein, but intend to cover all such modifications as are encompassed by the scope the appended claims.

What is claimed is:

1. An imaging apparatus comprising:
   an optical system for forming an optical image;
   a photoconductive region for converting the optical image into charge carriers, wherein the photoconductive region includes an amorphous semiconductor region in which charge multiplication of the charge carriers is induced, the amorphous semiconductor region comprising primarily selenium;
   means for applying an electric field to the photoconductive region, wherein said means for applying an electric field is a means for applying a sufficiently large electric field so as to induce the charge multiplication of the charge carriers in the photoconductive region; and
   means for converting charge carriers into a signal conforming to predetermined standards for processing.

2. The apparatus as set forth in claim 1, wherein the means for applying an electric field is a means for applying an electric field of $5 \times 10^7$ V/m to $2 \times 10^8$ V/m.

3. An imaging apparatus comprising:
   an optical system for forming an optical image;
   a photoconductive region for converting the optical image into charge carriers, wherein the photoconductive region includes an amorphous semiconductor region in which charge multiplication of the charge carriers is induced, the amorphous semiconductor region mainly comprising silicon carbide;

means for applying an electric field to the photoconductive region, wherein said means for applying an electric field is a means for applying a sufficiently large electric field so as to induce the charge multiplication of the charge carriers in the photoconductive region; and means for converting charge carriers into a signal conforming to predetermined standards for processing.

4. An imaging apparatus comprising:

an optical system for forming an optical image;

a photoconductive region for converting the optical image into charge carriers, wherein the photoconductive region includes an amorphous semiconductor region in which charge multiplication of the charge carriers is induced, and wherein a material forming hole traps is provided in the amorphous semiconductor region;

means for applying an electric field to the photoconductive region, wherein said means for applying an electric field is a means for applying a sufficiently large electric field so as to induce the charge multiplication of the charge carriers in the photoconductive region; and means for converting charge carriers into a signal conforming to predetermined standards for processing.

5. The apparatus as set forth in claim 4, wherein a material forming electron traps is provided in the amorphous semiconductor region.

6. An imaging apparatus comprising:

an optical system for forming an optical image;

a photoconductive region for converting the optical image into charge carriers, wherein the photoconductive region includes an amorphous semiconductor region in which charge multiplication of the charge carriers is induced, and wherein the amorphous semiconductor region includes at least one element selected from the group consisting of Te, Sb, Cd and Bi;

means for applying an electric field to the photoconductive region, wherein said means for applying an electric field is a means for applying a sufficiently large electric field so as to induce the charge multiplication of the charge carriers in the photoconductive region; and means for converting charger carriers into a signal conforming to predetermined standards for processing.

7. An imaging apparatus comprising:

an optical system for forming an optical image;

a photoconductive region for converting the optical image into charge carriers;

an optical carrier generation layer, for generating carriers upon absorption of incident light, provided adjacent the photoconductive region;

means for applying an electric field to the photoconductive region, wherein said means for applying an electric field is a means for applying a sufficiently large electric field so as to induce charge multiplication of the charge carriers in the photoconductive region; and means for converting charge carriers into a signal conforming to predetermined standards for processing.

8. The apparatus as set forth in claim 7, wherein the photoconductive region includes an amorphous semiconductor region in which the charge multiplication is induced.

9. The apparatus as set forth in claim 8, wherein the amorphous semiconductor region mainly comprises an element belonging to a tetrahedral system.

10. The apparatus as set forth in claim 9, wherein the element belonging to a tetrahedral system has a band width greater than 1.85 eV.

11. The apparatus as set forth in claim 8, wherein said amorphous semiconductor region includes at least one first element belonging to a tetrahedral system and at least one second element selected from the group consisting of hydrogen and halogen.

12. The apparatus as set forth in claim 7, further comprising a charge injection blocking region between the means for applying an electric field and the photoconductive region.

13. The apparatus as set forth in claim 12, further comprising charge injection blocking regions sandwiching the photoconductive region, between the means for applying an electric field and the photoconductive region.

14. The apparatus as set forth in claim 12, wherein the photoconductive region includes an amorphous semiconductor layer capable of charge multiplication.

15. The apparatus as set forth in claim 7, wherein the means for applying an electric field is a means for applying an electric field of $5 \times 10^7$ V/m to $2 \times 10^8$ V/m.

16. The apparatus as set forth in claim 7, wherein the means for applying an electric field includes a transparent electrode, positioned such that incident light to the photoconductive region passes through the transparent electrode.

17. The apparatus as set forth in claim 7, wherein the photoconductive region is a layer having a thickness of at least 0.5 μm, and not larger than 10 μm.

18. The apparatus as set forth in claim 7, wherein the optical carrier generation layer is made of a material selected from the group consisting of ZnS, CdS, ZnSe, CdSe, ZnTe, CdTe, 19. The apparatus as set forth in claim 7, wherein the means for applying an electric field includes a first electrode, wherein the photoconductive region includes a photoconductive layer for converting incident light of the optical image into carriers, and wherein the apparatus further comprises a blocking structure for blocking charge injection from the first electrode into the photoconductive layer under the electric field applied by the means for applying the electric field, so as to obtain said carriers as signals.

* * * * *